United States Patent
Nagamura et al.

(10) Patent No.: US 10,861,786 B2
(45) Date of Patent: Dec. 8, 2020

(54) SEMICONDUCTOR DEVICE HAVING A MULTILAYER STRUCTURE

(71) Applicant: RENESAS ELECTRONICS CORPORATION, Tokyo (JP)

(72) Inventors: Yoshikazu Nagamura, Ibaraki (JP); Takashi Ipposhi, Ibaraki (JP); Katsumi Eikyu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/446,078

(22) Filed: Jun. 19, 2019

(65) Prior Publication Data
US 2020/0006222 A1    Jan. 2, 2020

(30) Foreign Application Priority Data

Jun. 28, 2018    (JP) .................................. 2018-123267

(51) Int. Cl.
| | |
|---|---|
| *H01L 23/522* | (2006.01) |
| *H01L 21/768* | (2006.01) |
| *H01L 21/3213* | (2006.01) |
| *H01L 23/532* | (2006.01) |

(52) U.S. Cl.
CPC .... *H01L 23/5226* (2013.01); *H01L 21/32139* (2013.01); *H01L 21/76837* (2013.01); *H01L 23/53295* (2013.01)

(58) Field of Classification Search
CPC . H01L 51/56; H01L 51/5056; H01L 51/5072; H01L 51/5253; H01L 51/5016
USPC ........................................................ 257/773
See application file for complete search history.

(56) References Cited

U.S. PATENT DOCUMENTS

| | | | |
|---|---|---|---|
| 8,536,694 B2 | 9/2013 | Inomata | |
| 2006/0170046 A1* | 8/2006 | Hara | ....................... H01L 21/84 257/347 |
| 2015/0228586 A1* | 8/2015 | Usami | ............... H01L 23/53295 257/751 |
| 2016/0353044 A1* | 12/2016 | Kawano | ............. H01L 27/14687 |
| 2016/0365278 A1* | 12/2016 | Maeshima | ........... H01L 21/3212 |

FOREIGN PATENT DOCUMENTS

| | | |
|---|---|---|
| JP | 07-122635 A | 5/1995 |
| JP | 2011-040480 A | 2/2011 |

* cited by examiner

*Primary Examiner* — Andy Huynh
(74) *Attorney, Agent, or Firm* — McDermott Will & Emery LLP

(57) ABSTRACT

The semiconductor device has a wiring M 2, an interlayer insulating film IL3 formed on the wiring M 2, and two wirings M 3 formed on the interlayer insulating film IL3, and the wiring M 3 is connected to the wiring M 2 by a conductor layer PG2 formed in the interlayer insulating film IL3. A recess CC3 is formed on the upper surface IL3a of the interlayer insulating film IL3, and the recess CC3 is defined by a side surface S 31 connected to the upper surface IL3a and a side surface S 32 connected to the side surface S 31, and the side surface S 32 is inclined so that the width WC3 of the recess CC3 decreases in the direction from the upper surface IL3a of the interlayer insulating film IL3 toward the upper surface IL2a of the interlayer insulating film IL2.

13 Claims, 25 Drawing Sheets

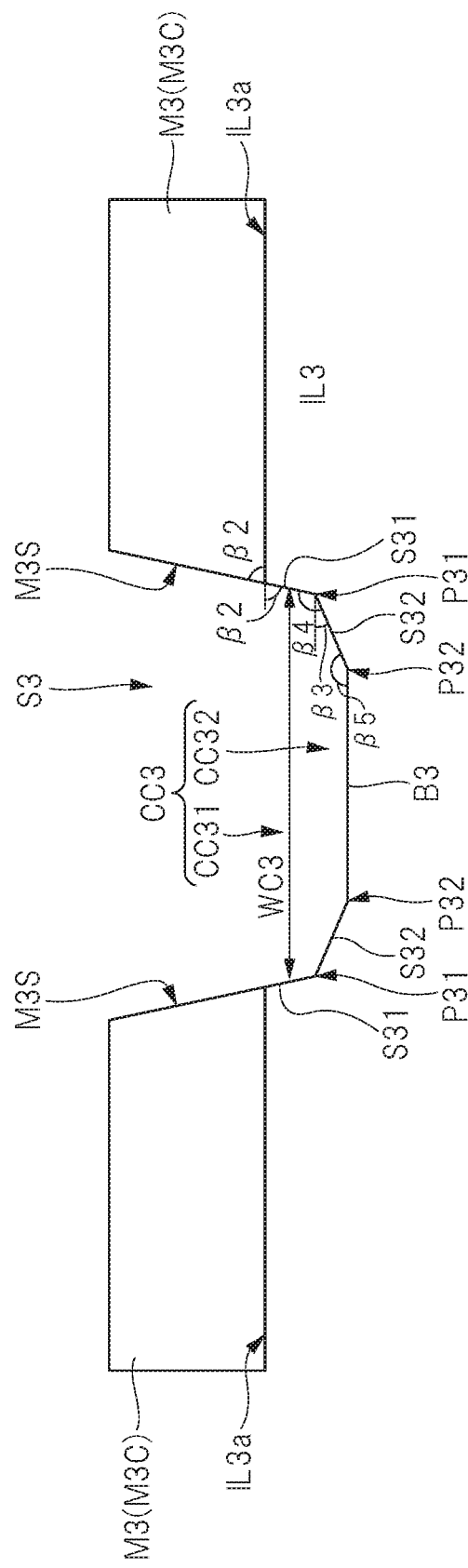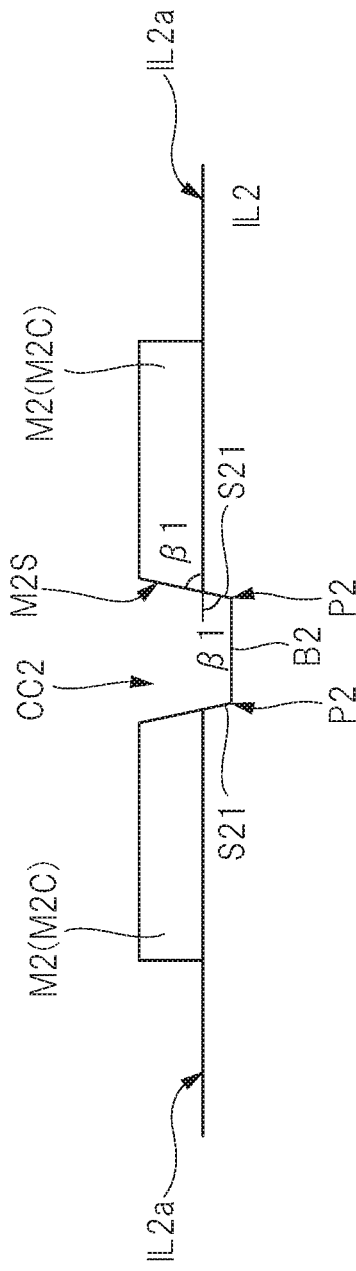
FIG. 4A
FIG. 4B

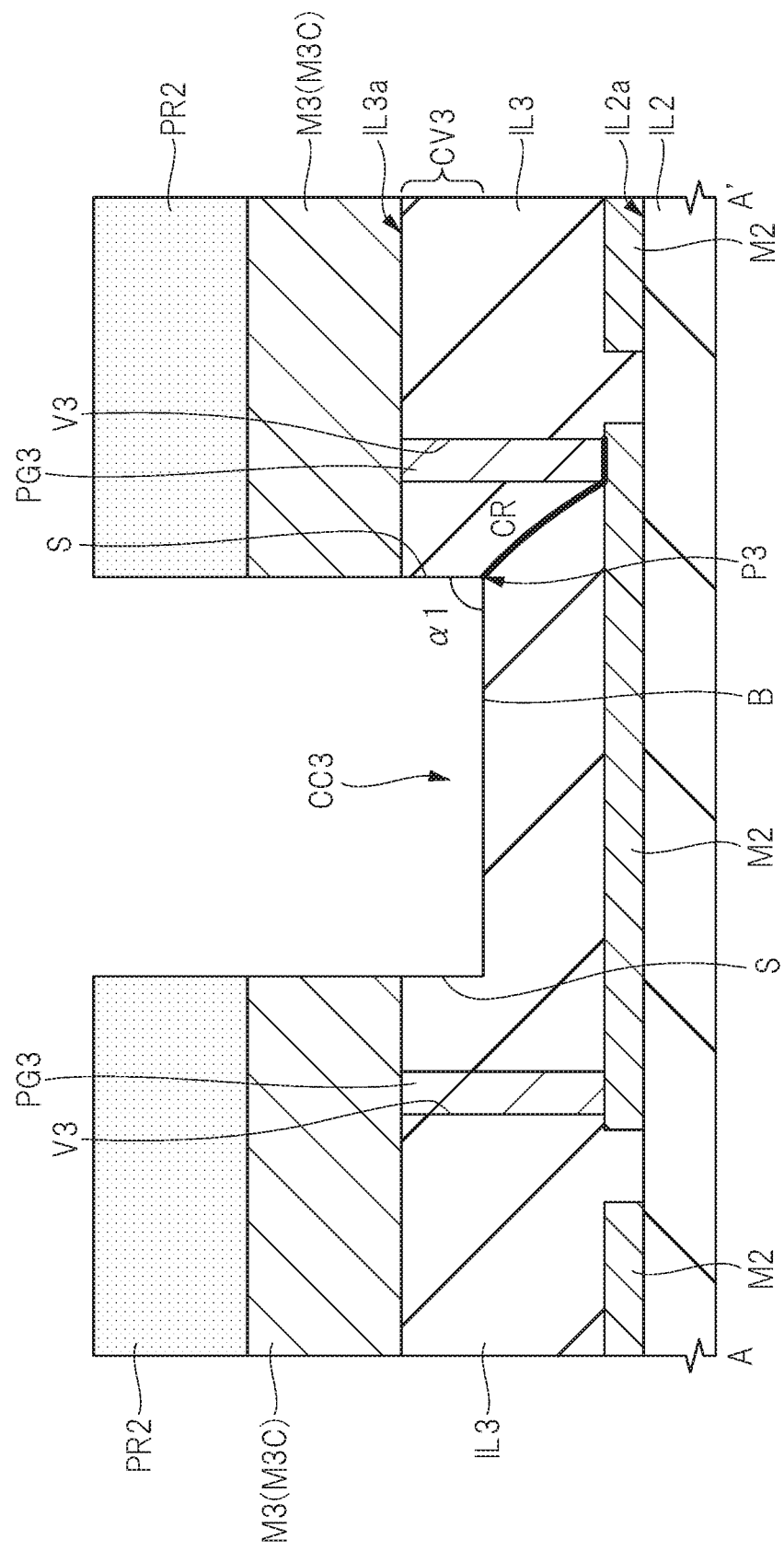

SEMICONDUCTOR DEVICE HAVING A MULTILAYER STRUCTURE

CROSS-REFERENCE TO RELATED APPLICATIONS

The disclosure of Japanese Patent Application No. 2018-123267 filed on Jun. 28, 2018 including the specification, drawings and abstract is incorporated herein by reference in its entirety.

BACKGROUND

The present invention relates to a semiconductor device, and can be suitably applied to, for example, a semiconductor device that allows a large current.

Japanese unexamined Patent Application publication No. 7-122635 discloses a structure for preventing cracks from occurring in an inorganic SOG film when a multilayer film composed of an $SiO_2$ insulating film, an inorganic SOG film, and an $SiO_2$ insulating film is used as an interlayer insulating film for Al wirings.

Japanese unexamined Patent Application publication No. 2011-40480 discloses a technique for preventing cracks generated during temperature cycling by chamfering the bottom of a dicing groove of a silicon substrate.

SUMMARY

The semiconductor device which allows a large current and which the inventor of the present application has studied is composed of, for example, three wiring layers formed on a semiconductor substrate and an interlayer insulating film which electrically separates the three wiring layers.

That is, a first wiring layer is formed on the semiconductor substrate with a first interlayer insulating film interposed therebetween, and a second interlayer insulating film, a second wiring layer, a third interlayer insulating film, and a third wiring layer are formed thereon in this order.

The first wiring layer, the second wiring layer, and the third wiring layer are each formed of an aluminum layer.

The film thickness of the third wiring layer, which is the uppermost layer, is very thick compared to the film thicknesses of the second and first wiring layers, which are the lower layers.

In the process of forming the three wiring layers, the aluminum layer is processed by the anisotropic dry etching method, and in the anisotropic dry etching process, the aluminum layer is processed to form a large number of wirings, and then overetching is performed to form recesses in the surface of the interlayer insulating film between adjacent wirings.

According to the study by the inventor of the present application, it has been confirmed that the film thickness of the third wiring layer is very thick, and that a crack is generated in the third interlayer insulating film from the recess as a starting point due to the formation of the recess on the surface of the third interlayer insulating film, and the reliability of the semiconductor device is lowered.

Details will be described later.

Other objects and novel features will become apparent from the description of this specification and the accompanying drawings.

According to one embodiment, a semiconductor device includes a semiconductor substrate including a main surface, a first interlayer insulating film formed on the main surface of the semiconductor substrate and including a first upper surface, a first wiring formed on the first upper surface, a second interlayer insulating film formed on the first upper surface so as to cover the first wiring and including a second upper surface, and a second wiring formed on the second upper surface.

The first wiring has a first film thickness, the second wiring has a second film thickness larger than the first film thickness, the second interlayer insulating film has a first recess extending from the second upper surface toward the first upper surface in a region in contact with the second wiring, the first recess is defined by a first side surface connected to the second upper surface and a second side surface connected to the first side surface in a cross-sectional view, and the second side surface is inclined so that the width of the first recess decreases in a direction from the second upper surface toward the first upper surface.

According to one embodiment, reliability of the semiconductor device can be improved.

BRIEF DESCRIPTION OF THE DRAWINGS

FIGS. 4(a) and (b) are drawings illustrating the configuration of the recesses in FIG. 3.

FIG. 25 is a cross-sectional view showing a manufacturing process of the semiconductor device of the study example.

DETAILED DESCRIPTION

Figure 1:
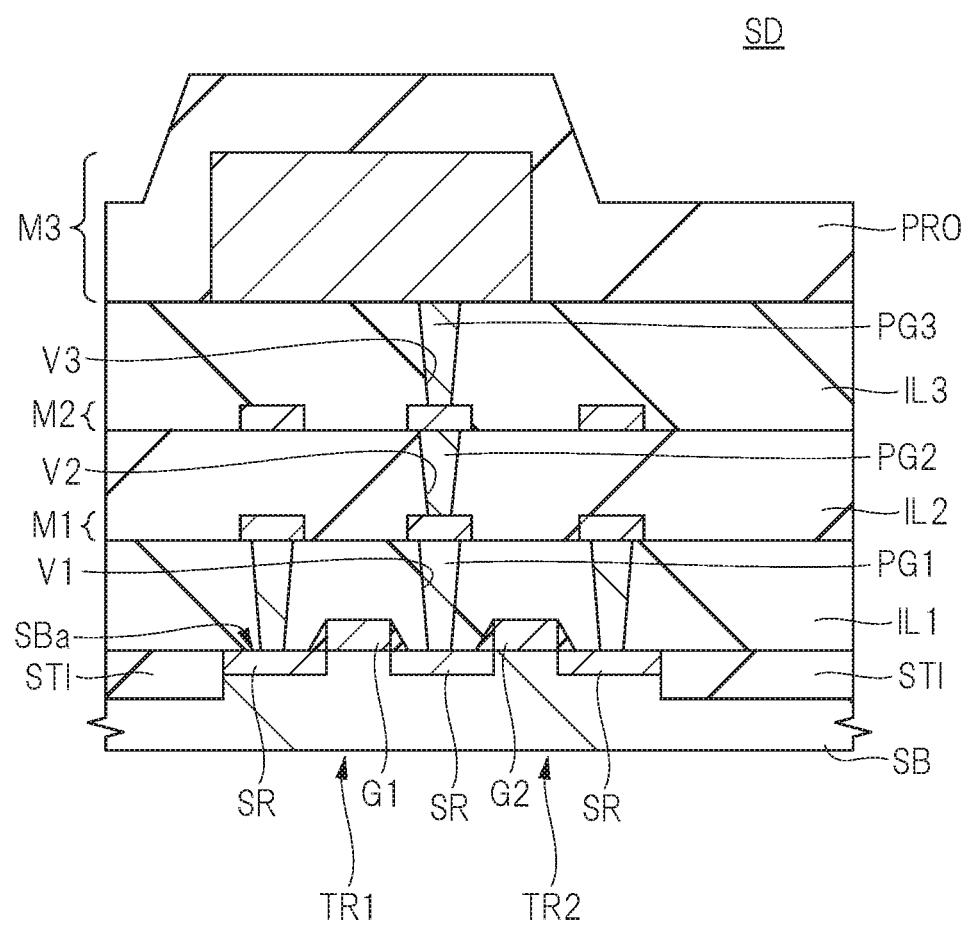
FIG. 1 is a cross-sectional view showing a configuration of a semiconductor device of the present embodiment.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail with reference to the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see even in a cross-sectional view. In addition, even in a plan view, hatching may be used to make the drawing easier to see.

In the following embodiments, "straight" includes "substantially straight" and "arc" includes "substantially arc".

EMBODIMENT (EXAMINATION EXAMPLE)

FIG. 25 is a cross-sectional view showing a manufacturing process of a semiconductor device of a study example. FIG. 25 is a cross-sectional view taken along line A-A' of FIG. 2, which will be described later. The plurality of wirings M 2 constituting the second wiring layer formed on the interlayer insulating film IL2 are covered with the interlayer insulating film IL3, and a plurality of wirings M 3 constituting the third wiring layer are formed on the interlayer insulating film IL3. The wiring M 3 is connected to the wiring M 2 through the conductive layer PG3 formed in the opening V 3 of the interlayer insulating film IL3.

FIG. 25 is a cross-sectional view showing an M 3 dry etching process (see FIG. 5) to be described later. Using the photoresist layer PR2 as a mask, the conductive layer M 3 C made of an aluminum layer is anisotropically dry etched to form a plurality of wirings M 3 on the interlayer insulating film IL3. Then, after the conductive layer M 3 C is processed, an overetching step of forming the recess CC3 on the interlayer insulating film IL3 is continuously performed. That is, the anisotropic dry etching conditions are the same in the overetching step and the dry etching step of the conductor layer M 3 C. The recess CC3 is defined by the side surface S and the bottom surface B, and the angle α 1 formed by the side surface S and the bottom surface B is approximately 90°. The overetching process is performed, for example, to prevent short-circuiting or leakage between adjacent wirings M 3. Because it is difficult to deposit an aluminum layer uniformly in the surface of a semiconductor wafer or a semiconductor device (chip) in a semiconductor wafer in which a plurality of semiconductor device formation regions are arranged in a matrix, and in-plane variations in the thickness of the aluminum layer occur. By performing the overetching step, the aluminum layer in the thick portion can be surely patterned, and short-circuiting or leakage between the adjacent wirings M 3 can be prevented. That is, when the dry etching process (including the overetching process) of the aluminum layer is completed, recess CC3 are formed on the upper surface of the interlayer insulating film IL3 between the wirings M 3, and the wirings M 3 are arranged on the convex portions CV3 of the interlayer insulating film IL3. Similarly, although not shown in FIG. 25, recess and convex portions are also formed on the interlayer insulating film IL2.

The aluminum layer is formed by, for example, a bias sputtering method, but the temperature of the lower electrode (inside the bias sputtering apparatus) on which the semiconductor wafer is placed is set to, for example, 150 to 200° C. in order to improve the film quality, and the temperature of the semiconductor wafer is set to, for example, 130 to 150° C. That is, when the semiconductor wafer is returned to room temperature after the aluminum layer is formed, residual stress (compressive stress) exists in the aluminum layer. Then, when the dry etching process of the aluminum layer is completed and the wiring M 3 is formed, residual stresses inherent in the wiring M 3 are applied to the convex CV3 of the interlayer insulating film IL3, and cracks CR are generated in the interlayer insulating film IL3. The crack CR extends from the corner portion P 3 located at the interface between the bottom surface B and the side surface S of the recess CC3 toward the opening V 3, and reaches the interface between the wire M 2 and the conductive layers PG3. Then, the inventor of the present application confirmed that the interconnection M 2 and the conductive layers PG3 are disconnected by the crack CR. To be precise, since the residual stresses inherent in the wiring M 3 are maximized at the corner CN of the wiring M 3 shown in FIG. 2 in plan view, the crack CR is generated from the corner P 3 of the recess CC3 corresponding to the corner CN of the wiring M 3 as a starting point.

The inventor of the present application believes that, since the wiring M 3 is formed of a thick aluminum layer, a very large residual stress exists in the wiring M 3, and that the crack CR is generated in the interlayer insulating film IL3 by forming the recess CC3 on the surface of the interlayer insulating film IL3 after the processing of the thick aluminum layer. In the dry etching process for forming the wiring M 3, since the temperature of the semiconductor wafer rises to 70 to 80° C., the inventor of the present application believes that the crack CR does not occur in the processing chamber of the dry etching apparatus, but occurs until the dry etching process is completed and the semiconductor wafer returns to room temperature, or after returning to room temperature.

Next, a semiconductor device for preventing the occurrence of the crack CR and a manufacturing method thereof will be described.

Figure 2:
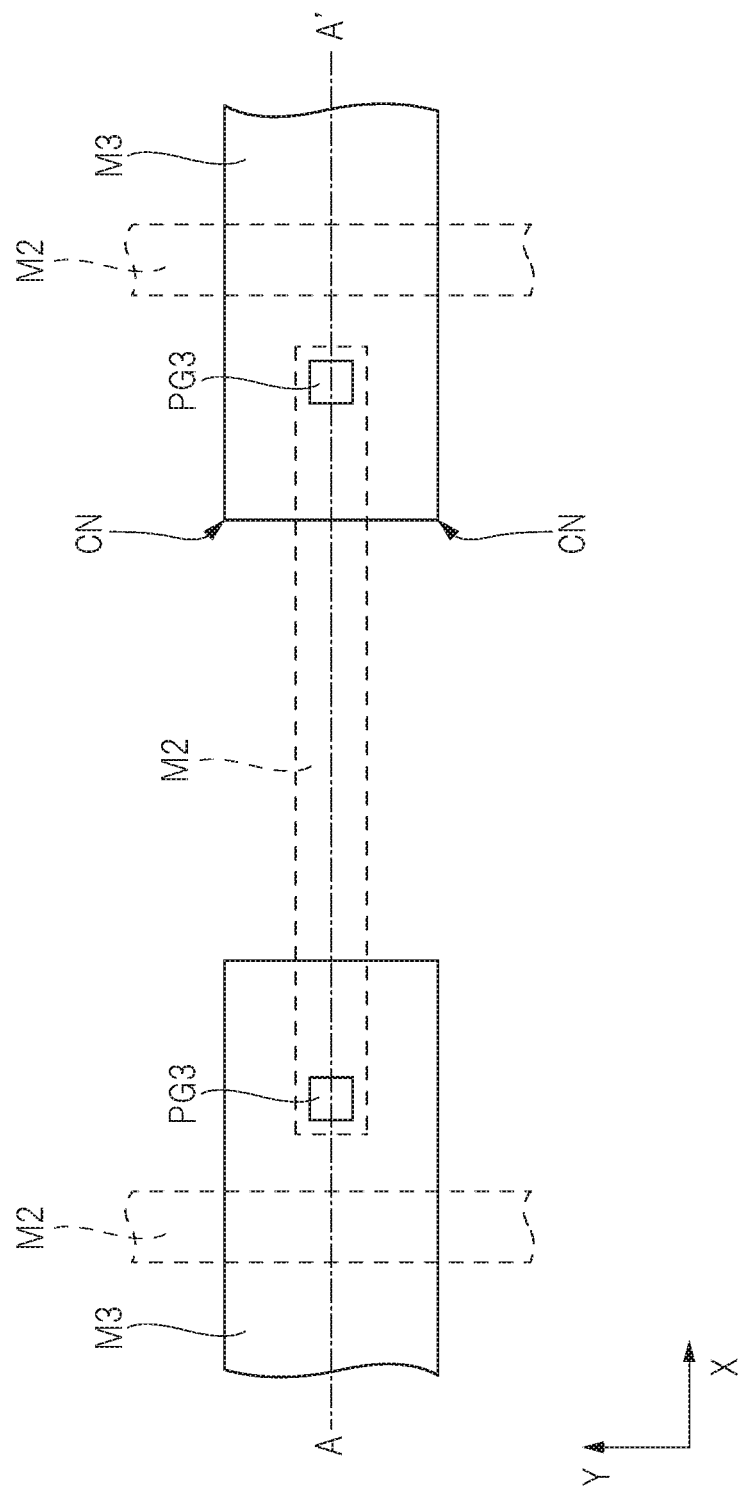
FIG. 2 is a plan view of a main part of a wiring layer of the semiconductor device of this embodiment.
Figure 3:
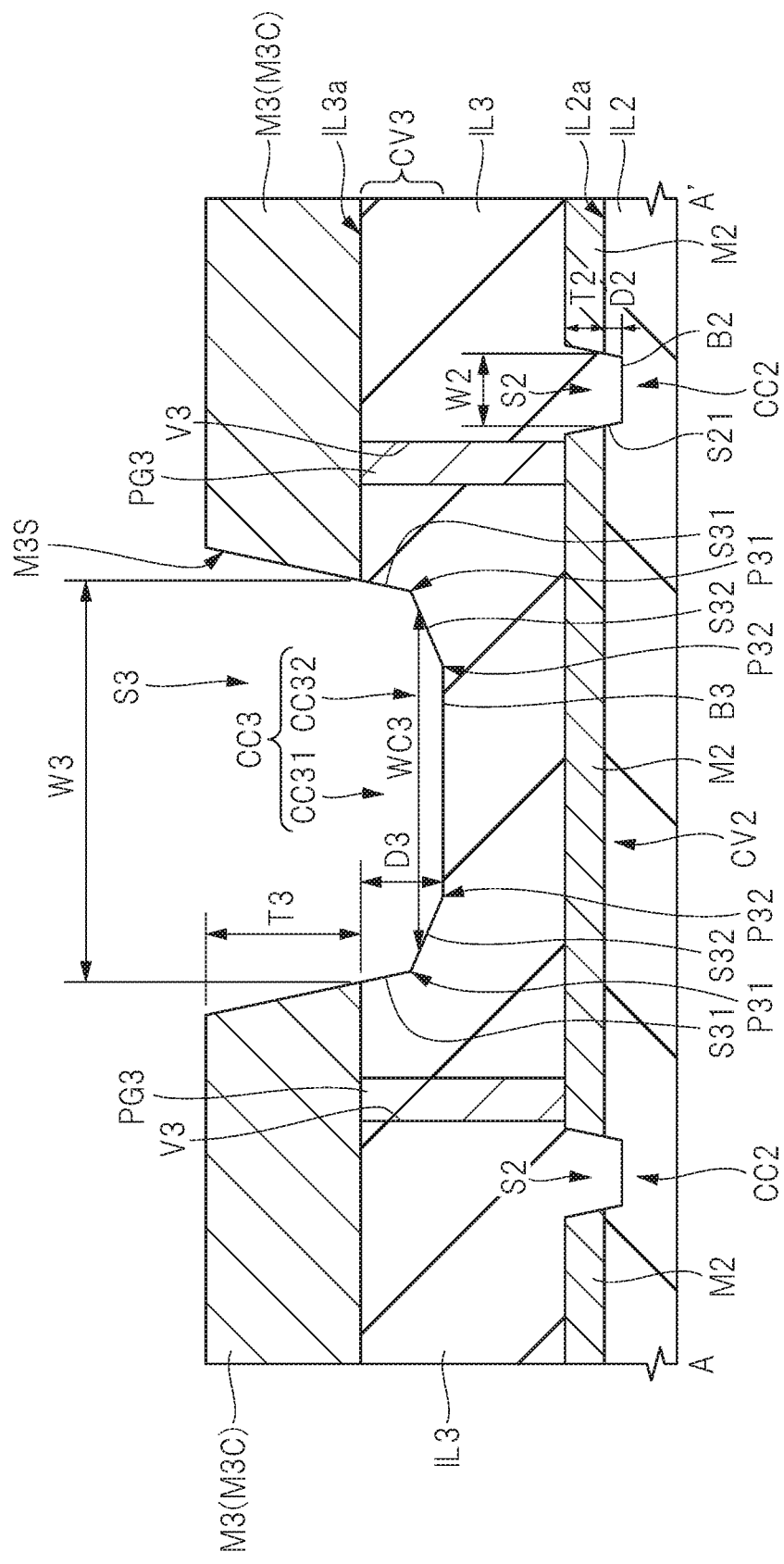
FIG. 3 is a cross-sectional view taken along line A-A' of FIG. 2.

Semiconductor Device FIG. 1 is a cross-sectional view showing the configuration of the semiconductor device SD of the present embodiment, and FIG. 2 is a plan view of the main part of the wiring layer of the semiconductor device SD of the present embodiment, showing the main part layouts of the second and third wiring layers. FIG. 3 is a cross-sectional view along the A-A' line of FIG. 2, and FIGS. 4(a) and (b) are drawings illustrating the configuration of the recess CC3 and the CC2.

As shown in FIG. 1, an element isolation film STI is formed in a silicon-based semiconductor substrate SB, and a plurality of transistors TR1 and TR2 are formed in an active area defined by the element isolation film STI around the silicon-based semiconductor substrate SB. The element isolation film STI is made of, for example, a silicon oxide film. The transistor TR1 or TR2 has a gate electrode G 1 or G 2 formed on the main surface SBa of the semiconductor substrate SB via a gate insulating film (not shown), and a pair of semiconductor regions SR formed in the semiconductor substrate SB at both ends of the gate electrode G 1 or G 2 and functioning as sources or drains. The transistor TR1 or TR2 is, for example, MISFET (Metal Insulator Semiconductor Field Effect Transistor).

The transistor TR1 or TR2 is covered with an interlayer insulating film IL1, and a first wiring layer including a plurality of wirings M 1, an interlayer insulating film IL2, a second wiring layer including a plurality of wirings M 2, an interlayer insulating film IL3, a third wiring layer including a plurality of wirings M 3, and a protective film PRO are sequentially formed on the interlayer insulating film IL1. The interconnection M 1 is connected to the semiconductor region SR via a conductor layer PG1 formed in an opening V 1 provided in the interlayer insulating film IL1. The wiring M 2 is connected to the wiring M 1 through the conductor layer PG2 formed in the opening V 2 provided in the interlayer insulating film IL2, and the wiring M 3 is connected to the wiring M 2 through the conductor layer PG3 formed in the opening V 3 provided in the interlayer insulating film IL3. The wirings M 1 to M 3 have a laminated structure composed of a lower barrier film, a main conductor film, and an upper barrier film, and the lower barrier film is, for example, a laminated structure composed of a titanium Ti film and a titanium nitride TiN film on the titanium Ti film, and the main conductor film is, for example, an aluminum Al film containing a trace amount of copper Cu, and the upper barrier film is, for example, a titanium nitride TiN film. The laminated structure constituting each of the wirings M 1 to M 3 is referred to as an aluminum layer. In each aluminum layer, the thickness of the main conductor film occupies twice or more of the total thickness of the lower barrier film and the upper barrier film. Incidentally, the thickness of the aluminum layer constituting the wirings M 1 and M 2 is 300 to 500 nm, and the thickness of the aluminum layer constituting the wiring M 3 is 2 to 4 μm. The interlayer insulating film IL1~IL3 is formed of a silicon oxide film or a laminated film of a silicon nitride film and a silicon oxide film thereon, and the protective film PRO is formed of a laminated film of a silicon oxide film and a silicon nitride film thereon. In the present embodiment, the wiring M 2 may be thicker than the wiring M 1. In addition, four or more wiring layers can be used.

As shown in FIG. 2, the two wirings M 3 separated from each other have a desired width in the Y direction and extend in the X direction. The two wirings M 3 adjacent to each other in the X direction are connected by a wiring M 2 extending in the X direction. In other words, the two wirings M 3 are connected to the wirings M 2 extending in the X-direction via the conductive layers PG3. Further, at both ends of the wiring M 2 extending in the X direction, the wiring M 2 extending in the Y direction is arranged apart from the wiring M 2.

FIG. 3 is a cross-sectional view taken along line A-A' of FIG. 2, and is a cross-sectional view of a stage in which an M 3 dry etching process (see FIG. 5) described later is completed (however, a resist layer PR2 described later is omitted). An interlayer insulating film IL2 is formed above the main surface SBa of the semiconductor substrate SB (not shown), and a plurality of wirings M 2 are formed on the upper surface IL2a of the interlayer insulating film IL2. An interlayer insulating film IL3 is formed so as to cover the plurality of wirings M 2, and a plurality of wirings M 3 are formed on the upper surface IL3a of the interlayer insulating film IL3. The two adjoining wirings M 3 are connected to the wirings M 2 via conductive layers PG3 provided in openings V 3 formed in the interlayer insulating film IL3, respectively. In the area between the two neighboring wirings M 3, a recess CC3 extending from the upper surface IL3a toward the upper surface IL2a is formed on the upper surface IL3a of the interlayer insulating film IL3. Since the recess CC3 is formed in the area around the wiring M 3 and in contact with the wiring M 3 in plan view, the wiring M 3 is arranged on the convex portion CV3 of the interlayer insulating film IL3. In the convex portion CV3, the upper surface IL3a of the interlayer insulating film IL3 has a flat surface subjected to CMP (Chemical Mechanical Polishing: Chemical Mechanical Polishing) treatment. The recess CC3 is defined by the straight side surfaces S 31 and S 32 provided on the interlayer insulating film IL3 and the bottom surface B 3. Here, the recess CC3 is defined by two side surfaces S 31 and S 32, but may be defined by three or more straight side surfaces.

The recess CC3 includes a recess CC31 defined by the side surface S 31 and a recess CC32 defined by the side surface S 32, and has a depth D 3. The depth D 3 is a length from the top surface IL3a of the interlayer insulating film IL3 to the bottom surface B 3. The depth D 3 is determined by an overetching amount required for processing the conductor layer M 3 C.

As shown in FIG. 4A, the side surface S 31 forms an angle β2 (β2≤90°) with respect to the extension line of the top surface IL3a, and the side surface S 32 forms an angle β 3 with respect to a straight line parallel to the top surface IL3a. On the recess CC3 side, the side surfaces S 31 and S 32 form an angle β 4, and the side surface S 32 and the bottom surface B 3 form an angle β 5. Further, as shown in FIG. 4A, the recess CC3 is symmetrical with respect to the center line (not shown).

FIG. 3 or FIG. 4(a) shows the case where the angle θ 2 is less than 90°. The side surface M 3 S of the wire M 3 forms an angle β 2 with respect to the upper surface IL3a, and the side surface M 3 S and the side surface S 31 are positioned on the same straight line in the cross-sectional view. In the M 3 dry etching process, after the conductive layer M 3 C is patterned under the first etching condition, the interlayer insulating film IL3 is subjected to the first overetching process under the same first etching condition to form the recess CC31 defined by the side surface S 31. Next, a second overetching process is performed on the interlayer insulating film IL3 under the second etching condition to form a recess CC32 defined by the side surface S 32. Here, it is important to make the angle β 3 smaller than the angle β 2 (β 3 2). In other words, the side surfaces S 31 and S 32 are inclined so that the widthwise WC3 of the recess CC3 decreases from the top surface IL3a toward the top surface IL2a. When β 2=90°, the side surface S 32 is inclined such that the width of the recess CC3 decreases in the direction from the top surface IL3a toward the top surface IL2a. With such a relationship, since the angles β 4 and β 5 can be larger than 90° (β 4, β 5>90°), the stress applied to the corner portions P 31 and P 32 can be relaxed (reduced) as compared with the case of the above-mentioned examination example by the residual stress of the wiring M 3. Therefore, the crack CR described in the study example can be prevented.

The corner portion P 31 is an intersection of the side surface S 31 and the side surface S 32, and the corner portion S 32 is an intersection of the side surface S 32 and the bottom surface B 3. That is, the recess CC31 is formed to prevent short-circuiting or leakage between the adjacent wirings M 3, and the recess CC32 is provided to prevent short-circuiting or leakage between the adjacent wirings M 3 and to prevent cracks CRs from occurring.

As shown in FIG. 3 or FIG. 4B, also in the M 2 dry etching step, after patterning the conductive layer M 2C under desired etching conditions, overetching is performed on the interlayer insulating film IL2 under similar etching conditions to form the recess CC2 defined by the side surface S 21 and the bottom surface B 2. The recess CC2 is provided to prevent short-circuiting or leakage between the neighboring wirings M 2. Since the residual stress inherent in the wiring M 2 is smaller than the residual stress inherent in the wiring M 3, it is not necessary to provide a recess for stress relaxation. Therefore, the inclination of the side surface S 21 of the recess CC2 is steeper than the inclination of the side surface S 32 defining the recess CC32. That is, the angle β 1 is larger than the angle β 3 (β 1>β 3).

As shown in FIG. 3, the recess CC2 is filled with the interlayer insulating film IL3. The recess CC2 has a depth D2, and the depth D2 is shallower than the depth D3. This is because, since the wiring M 2 is thinner than the wiring M 3, the depth of the overetching can be made shallow, and it is not necessary to provide a recess for stress relaxation. The depth D2 is a length from the top surface IL2a of the interlayer insulating film IL2 to the bottom surface B 2. The side surface S 21 forms an angle β 1 (β 1≤90°) with respect to the extension line of the upper surface IL2a. In FIG. 3 or FIG. 4B, the case where the angle β 1 is less than 90 degrees is shown, but the angle β 1 may be 90 degrees. The side surface M 2S of the wire M 2 forms an angle β 1 with respect to the upper surface IL2a, and the side surface M 2S and the side surface S 21 are positioned on the same straight line in the cross-sectional view. Further, when the etching condition of the conductor layer M 2C is made equal to the first etching condition of the conductor layer M 3 C, the angle β 1 becomes larger than the angle β 2 (β 1>β 2). This is because the film thickness of the wiring M 3 to be etched is thicker than the film thickness of the wiring M 2. Although the wiring M 2 and the wiring M 3 made of the aluminum film are processed by the anisotropic dry etching method, in the anisotropic dry etching method, the etching of the aluminum film and the deposition of the reaction product (called "polymer") on the sidewall of the etched aluminum film proceed simultaneously. The etching proceeds while the polymer deposited on the sidewall of the etched aluminum film serves as a mask. Therefore, the thicker the interconnection M 3 is, the thicker the deposited polymer is, the angle β 2 becomes smaller than the angle β 1.

Method of Manufacturing Semiconductor Device

Figure 5:
FIG. 5 is a process flow diagram showing a part of the manufacturing process of the semiconductor device of the present embodiment.

Next, a method of manufacturing a semiconductor device will be described with reference to FIGS. 5 to 14. FIG. 5 is a process flow diagram showing a part of the manufacturing process of the semiconductor device of the present embodiment. FIGS. 6 to 7 and 9 to 14 are cross-sectional views showing the manufacturing process of the semiconductor device of the present embodiment.

Figure 8:
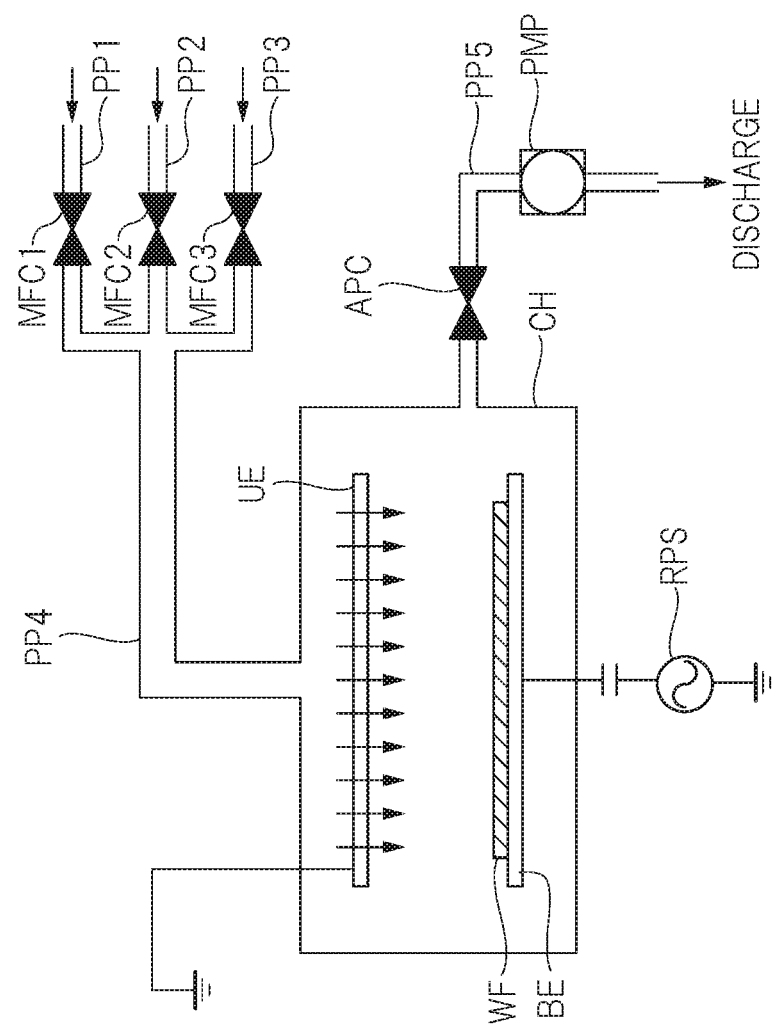
FIG. 8 is a configuration diagram of an etching apparatus used in the manufacturing process of the semiconductor device of this embodiment.

FIG. 8 is a configuration diagram of an etching apparatus used in the manufacturing process of the semiconductor device of this embodiment. Here, a description will be given of the steps after the step of forming the second wiring layer described with reference to FIG. 1. In the manufacturing process of the semiconductor device, a large number of semiconductor devices are formed in the disk-shaped semiconductor substrate SB, but for convenience, the disk-shaped semiconductor substrate SB is sometimes referred to as a semiconductor wafer.

Figure 6:
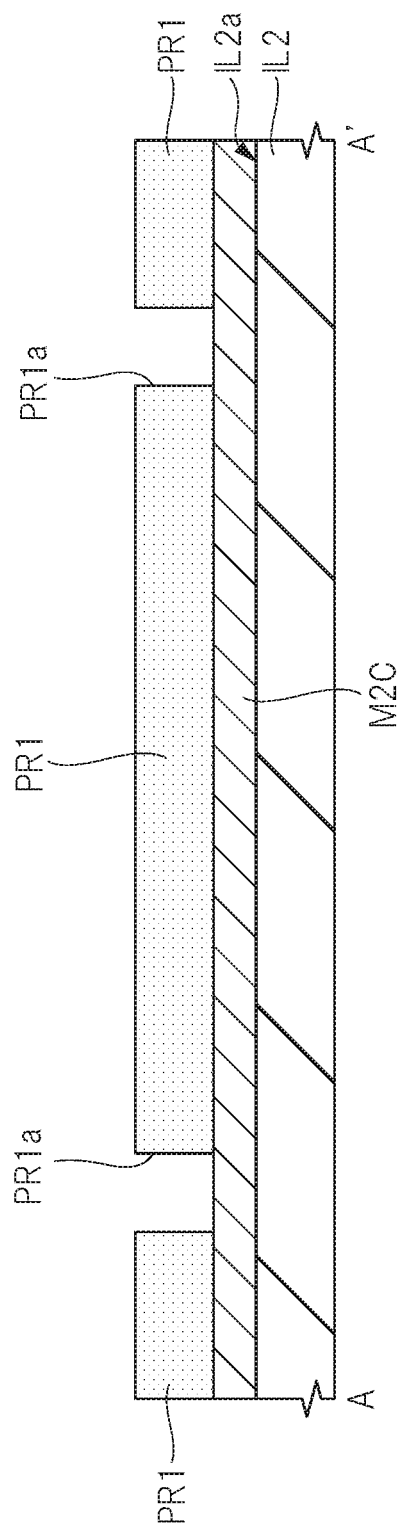
FIG. 6 is a cross-sectional view showing a manufacturing process of the semiconductor device of the present embodiment.

First, the conductor layer M 2C deposition step and the M 2 mask formation step shown in FIG. 5 will be described. As shown in FIG. 6, an interlayer insulating film IL2 is formed on the main surface SBa (see FIG. 1) of the semiconductor substrate SB (not shown), and then a conductive layer M 2C is deposited on the interlayer insulating film IL2. Since the conductor layer M 2C is an aluminum layer and is formed using the bias sputtering method described above, residual stress exists in the aluminum layer M 2C when the semiconductor wafer returns to room temperature. Note that the upper surface IL2a of the interlayer insulating film IL2 has a flat surface subjected to CMP-process. Next, M 2 masks having a plurality of openings PR1a are formed on the conductive layers M 2C. The M 2 masks are photoresist-layer PR1.

Figure 7:
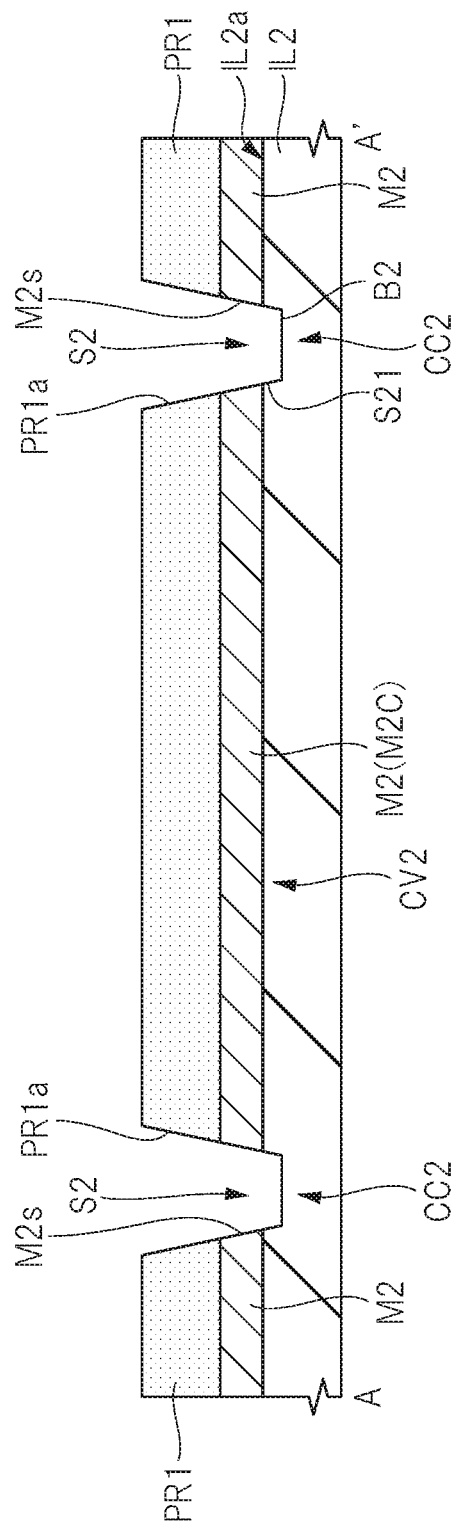
FIG. 7 is a cross-sectional view showing the manufacturing process of the semiconductor device continued from FIG. 6.

Next, the M 2 dry etching process shown in FIG. 5 will be described. As shown in FIG. 7, the conductive layer M 2C is anisotropically dry-etched to form wirings M 2 in regions covered with the photo-resist layer PR1. Here, an example in which an inclination is formed on the side surface M 2S of the wiring M 2 is shown, but the inclination can be eliminated. Then, after the conductive layer M 2C is patterned to form the wiring M 2, anisotropic dry etching is continued for a predetermined period of time to form the recess CC2 on the upper surface IL2a of the interlayer insulating film IL2 between the wirings M 2. This is an overetching process, and the M 2 dry etching process includes an etching process of the conductor layer M 2C and an overetching process. The shapes of the wirings M 2 and the recess CC2 formed by the M 2 dry-etching process are as described with reference to FIG. 4.

The M 2 dry etching process is performed using, for example, an etching apparatus shown in FIG. 8. The etching apparatus is, for example, a reactive ion etching apparatus of a parallel plate type. In the processing chamber CH, an upper electrode UE and a lower electrode BE on which the semiconductor wafer WF is placed are disposed. The $Cl_2$ gas and the $BCl_3$ gas, which are etching gases, and the Ar gas, which is a rare gas, are introduced into the processing chamber CH through the pipe PP1~PP4 and the mass flow controller MFC1~MFC3, and the etching gas and the like in the processing chamber CH are discharged to the outside through the pipe PP5, the valves APC and the pumps PMP. A high-frequency power source RPS is connected to the lower electrode BE, and plasma is generated between the upper electrode UE and the lower electrode BE by applying high-frequency power to the lower electrode BE. Then, anisotropic reactive ion etching is performed by making ions in the plasma perpendicularly incident on the semiconductor wafer WF. For example, when the high-frequency power is increased, the incident energy of ions is increased and anisotropy is increased. In the M 2 dry etching step, the etching step and the overetching step of the conductive layer M 2C are performed without changing the high-frequency power, so that the inclination angles of the side surface M 2S of the wire M 2 and the side surface S 21 of the recess CC2 become substantially equal as described with reference to FIG. 3 or FIG. 4B.

After the M 2 dry etching process is completed, the photoresist-layer PR1 removing process shown in FIG. 5 is performed. For example, the photoresist layer PR1 is decomposed and removed by exposing the photoresist layer PR1 to an oxygen-plasma.

Next, the interlayer insulating film IL3 forming step and the conductive layer PG3 forming step shown in FIG. 5 will be described with reference to FIG. 9. After an interlayer insulating film IL3 is deposited on a semiconductor substrate SB (not shown) so as to cover the wirings M 2, the interlayer insulating film IL3 is subjected to a CMP process to form an interlayer insulating film IL3 having a flat upper surface IL3a.

Figure 9:
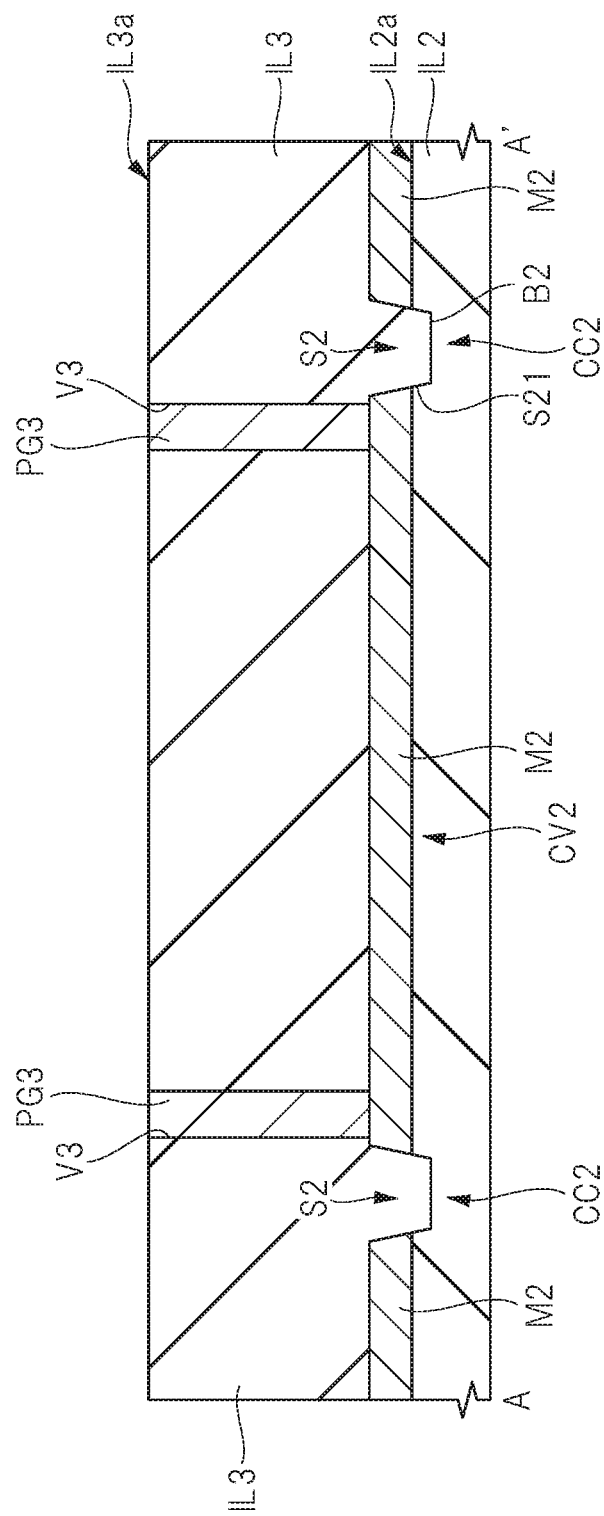
FIG. 9 is a cross-sectional view showing the manufacturing process of the semiconductor device continued from FIG. 7.

Next, as shown in FIG. 9, an opening V 3 in which a part of the interconnection M 2 is exposed is formed in the interlayer insulating film IL3, and a conductive layer PG3 is formed in the opening V 3 so as to fill the opening V 3.

Figure 10:
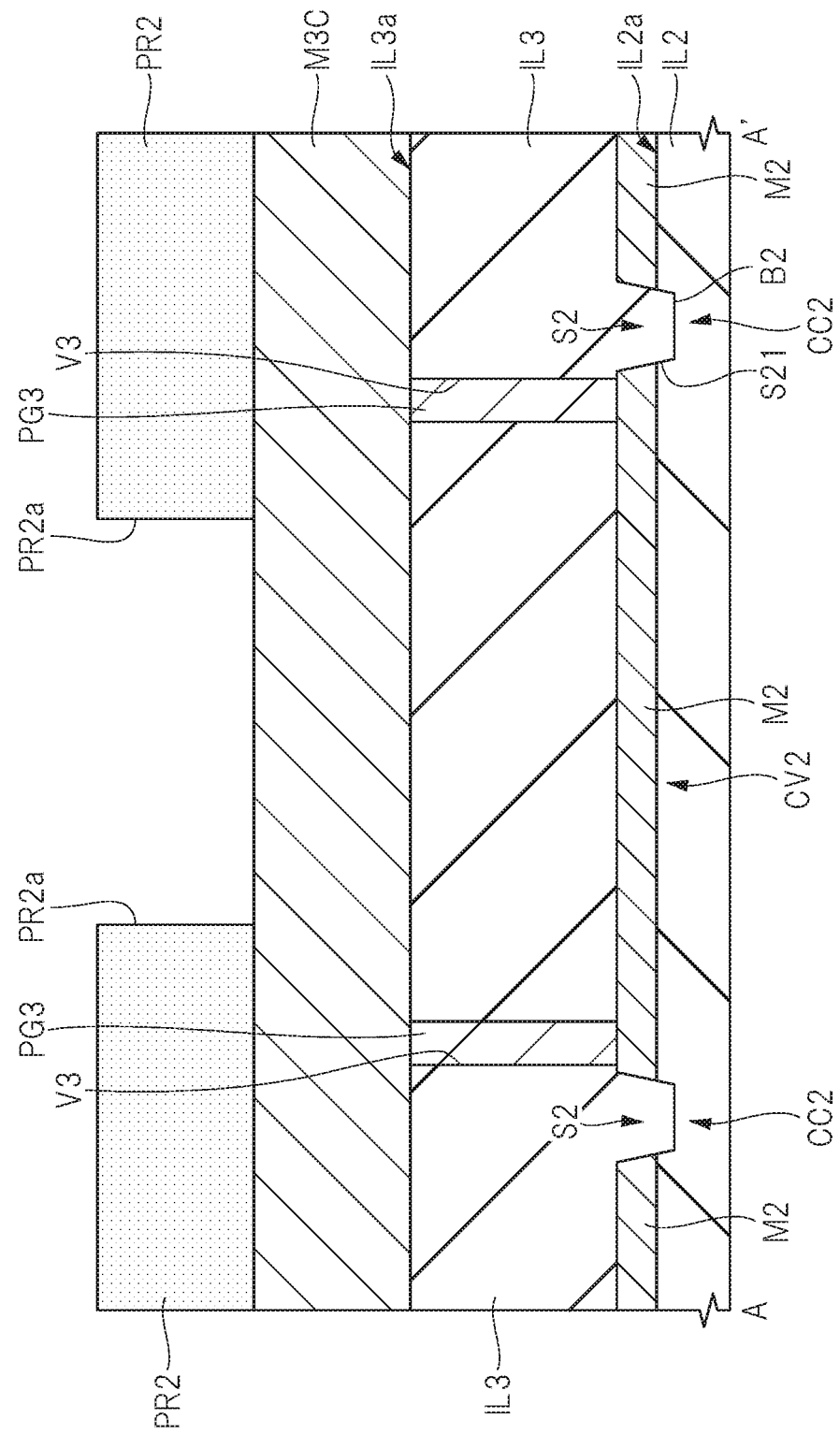
FIG. 10 is a cross-sectional view showing the manufacturing process of the semiconductor device continued from FIG. 9.

Next, the conductor layer M 3 C deposition step and the M 3 mask formation step shown in FIG. 5 will be described with reference to FIG. 10. A conductive layer M 3 C, which is an aluminum layer, is deposited on the upper surface IL3a of the interlayer insulating film IL3 by the bias sputtering method described above. Since the film thickness of the conductor layer M 3 C is very thick compared to the film thickness of the conductor layer M 2C, when the semiconductor wafer returns to room temperature, a very large residual stress exists in the aluminum layer M 3C. Next, M 3 masks having an opening PR2a are formed on the conductive layers M 3 C. The M 3 masks are photoresist-layer PR2.

Figure 11:
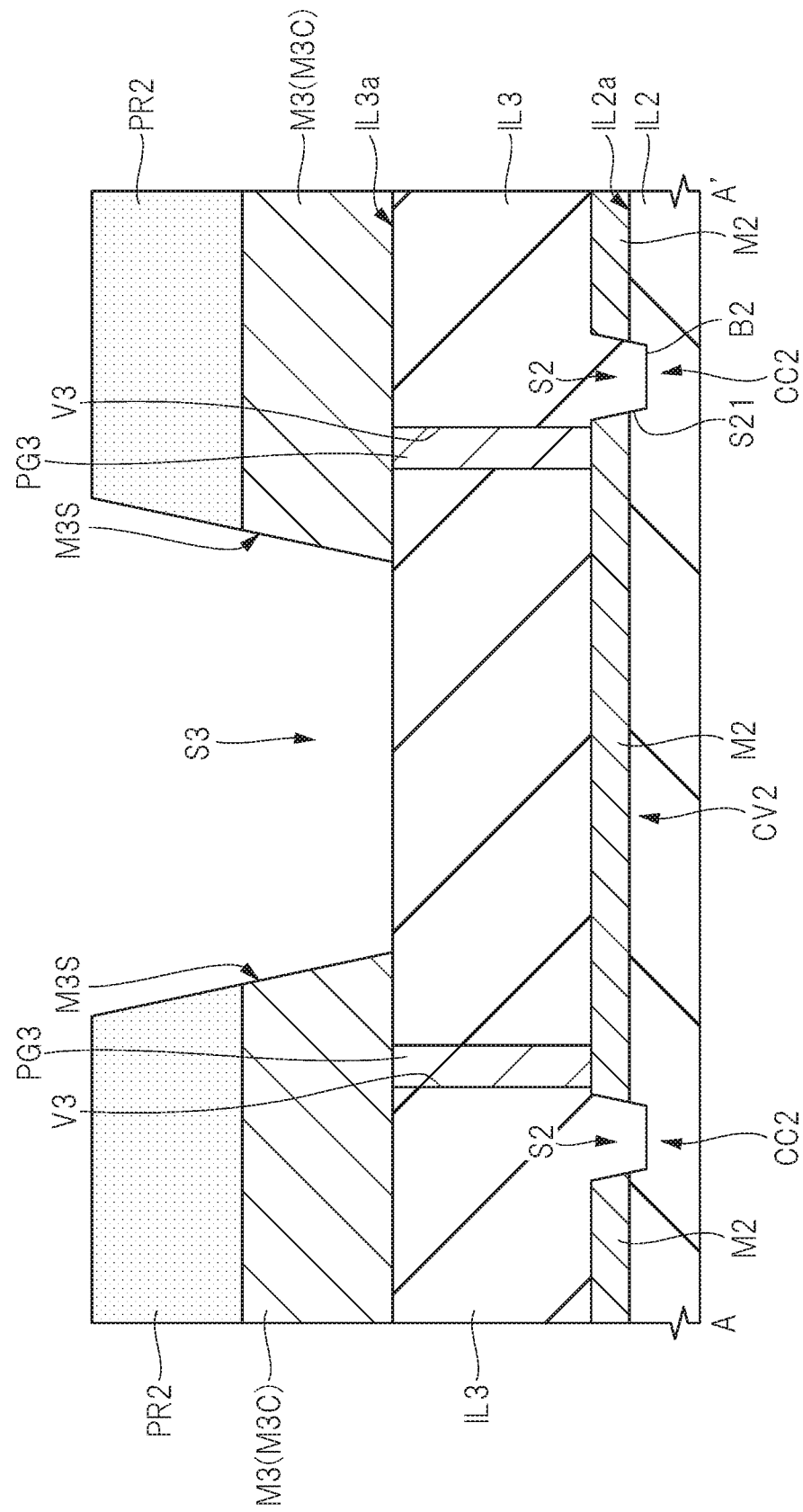
FIG. 11 is a cross-sectional view showing the manufacturing process of the semiconductor device continued from FIG. 10.
Figure 12:
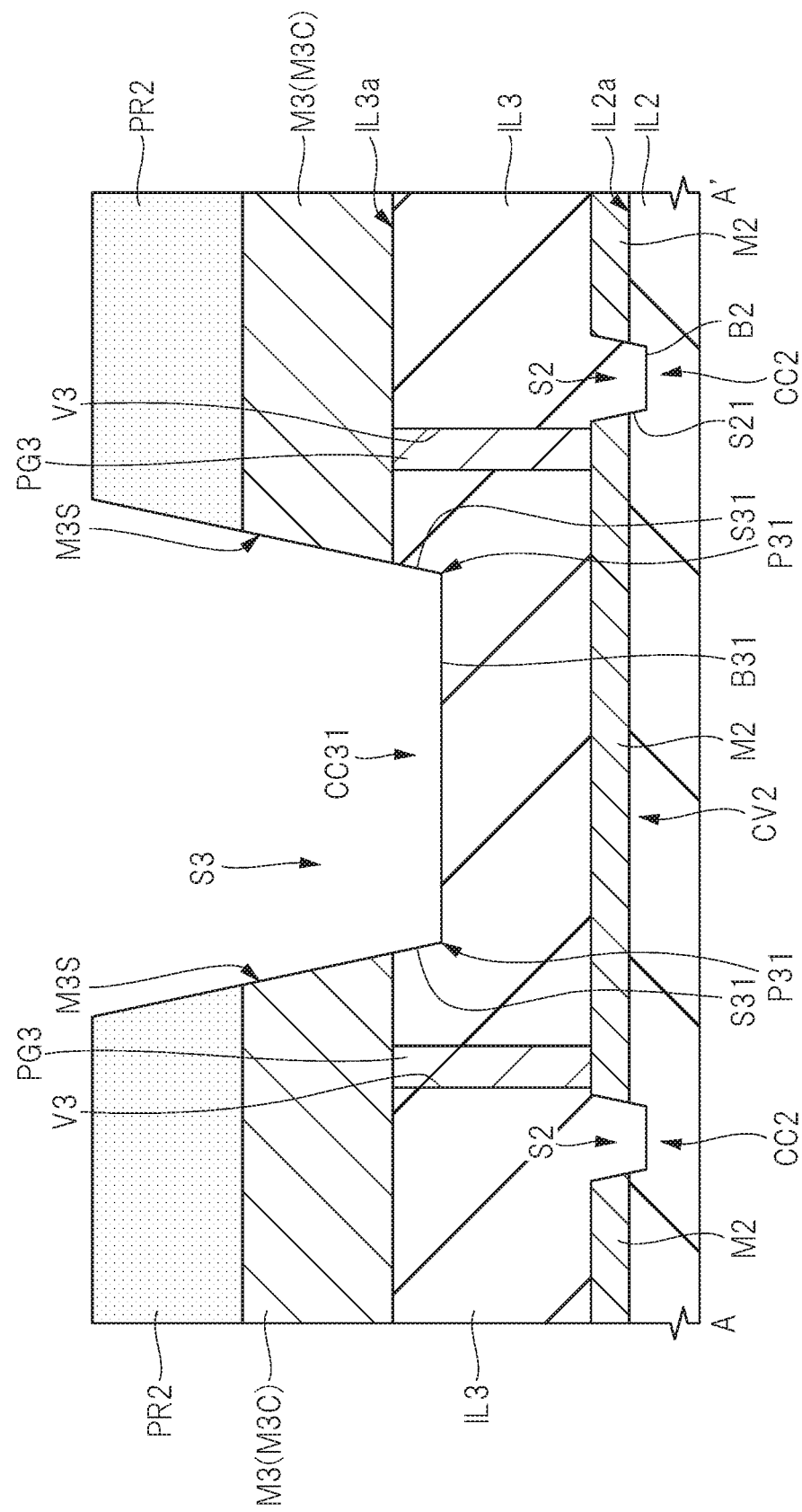
FIG. 12 is a cross-sectional view showing the manufacturing process of the semiconductor device continued from FIG. 11.
Figure 13:
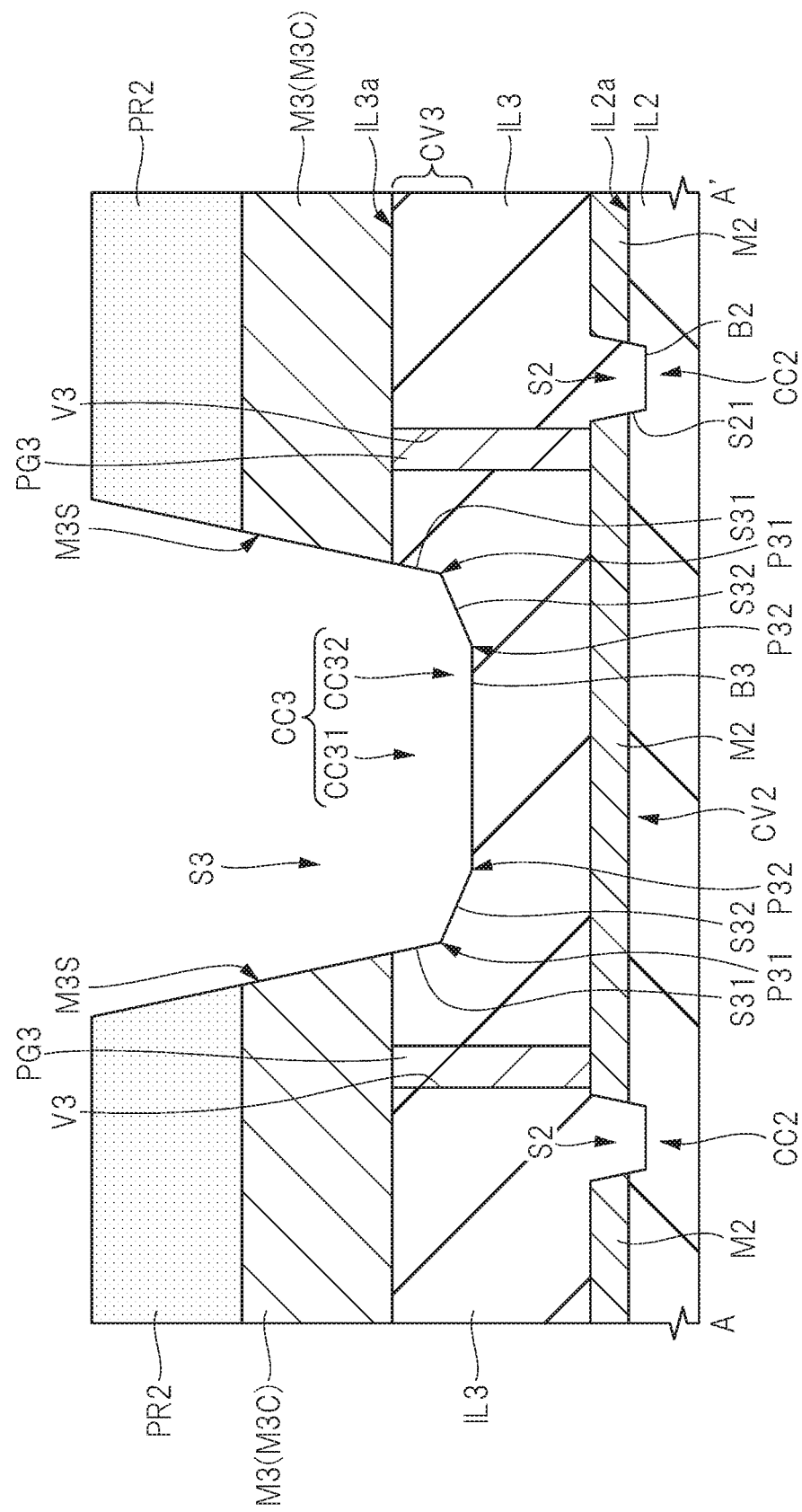
FIG. 13 is a cross-sectional view showing the manufacturing process of the semiconductor device continued from FIG. 12.

Next, the M 3 dry etching process shown in FIG. 5 will be described. As shown in FIG. 11, the conductive layer M 3 C is anisotropically dry-etched to form wirings M 3 in regions covered with the photo-resist layer PR2. In this example, although an example in which an inclination is formed on the side surface M 3 S of the wire M 3 is shown, the side surface M 3 S can be processed perpendicularly to the upper surface IL3a. Then, as shown in FIG. 12, after the conductive layer M 3 C is patterned to form the wiring M 3, anisotropic dry etching is continued for a predetermined period of time to form the recess CC31 on the upper surface IL3a of the interlayer insulating film IL3 between the wirings M 3. The recess CC31 is defined by the side surface S 31. This is the first overetching step described above. The dry etching process and the first overetching process of the conductor layer M 3 C are performed under the same conditions as the aforementioned M 2 dry etching process, but may be performed under different conditions. Following the first overetching step, a second overetching step is performed as shown in FIG. 13 to form a recess CC32 below the recess CC31. The recess CC32 is defined by the side surface S 32. In the second overetching step, for example, the high-frequency power applied to the lower electrode BE of the etching apparatus is made lower than the high-frequency power in the first overetching step. For example, the high-frequency power is 60 to 70% of the high-frequency power in the first overetching process. As a result, the anisotropy of the dry etching can be weakened, and as described with reference to FIG. 3 or FIG. 4A, the inclination of the side surface S 32 can be made more gradual than the inclination of the side surface S 31. As described above, the M 3 dry etching process shown in FIG. 5 includes the dry etching process, the first overetching process, and the second overetching process of the conductor layer M 3 C. The recess CC3 formed in the interlayer insulating film IL3 is composed of a recess CC31 formed in the first overetching process and a recess CC32 formed in the second overetching process.

After the M 3 dry etching process is completed, the photoresist-layer PR2 removing process shown in FIG. 5 is performed. For example, the photoresist layer PR2 is decomposed and removed by exposing the photoresist layer PR2 to an oxygen-plasma.

Figure 14:
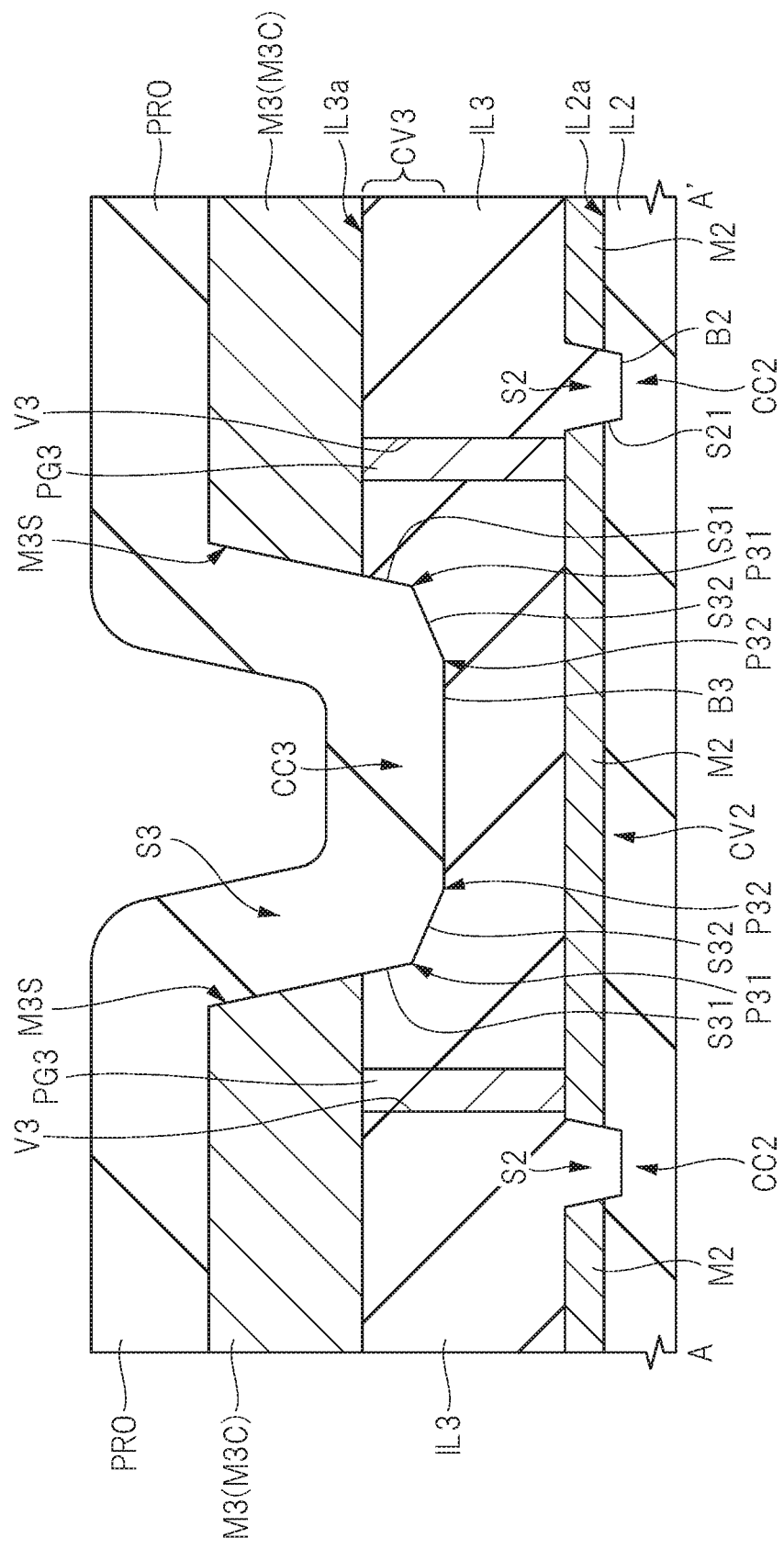
FIG. 14 is a cross-sectional view showing the manufacturing process of the semiconductor device continued from FIG. 13.

Next, a protective film PRO forming step shown in FIG. 5 is performed. As shown in FIG. 14, a protective film PRO is formed on the semiconductor substrate SB (not shown) so as to fill the recess CC3 and cover the interconnection M 3.

The semiconductor device of this embodiment is manufactured through at least the above steps.

Modification 1

Figure 15:
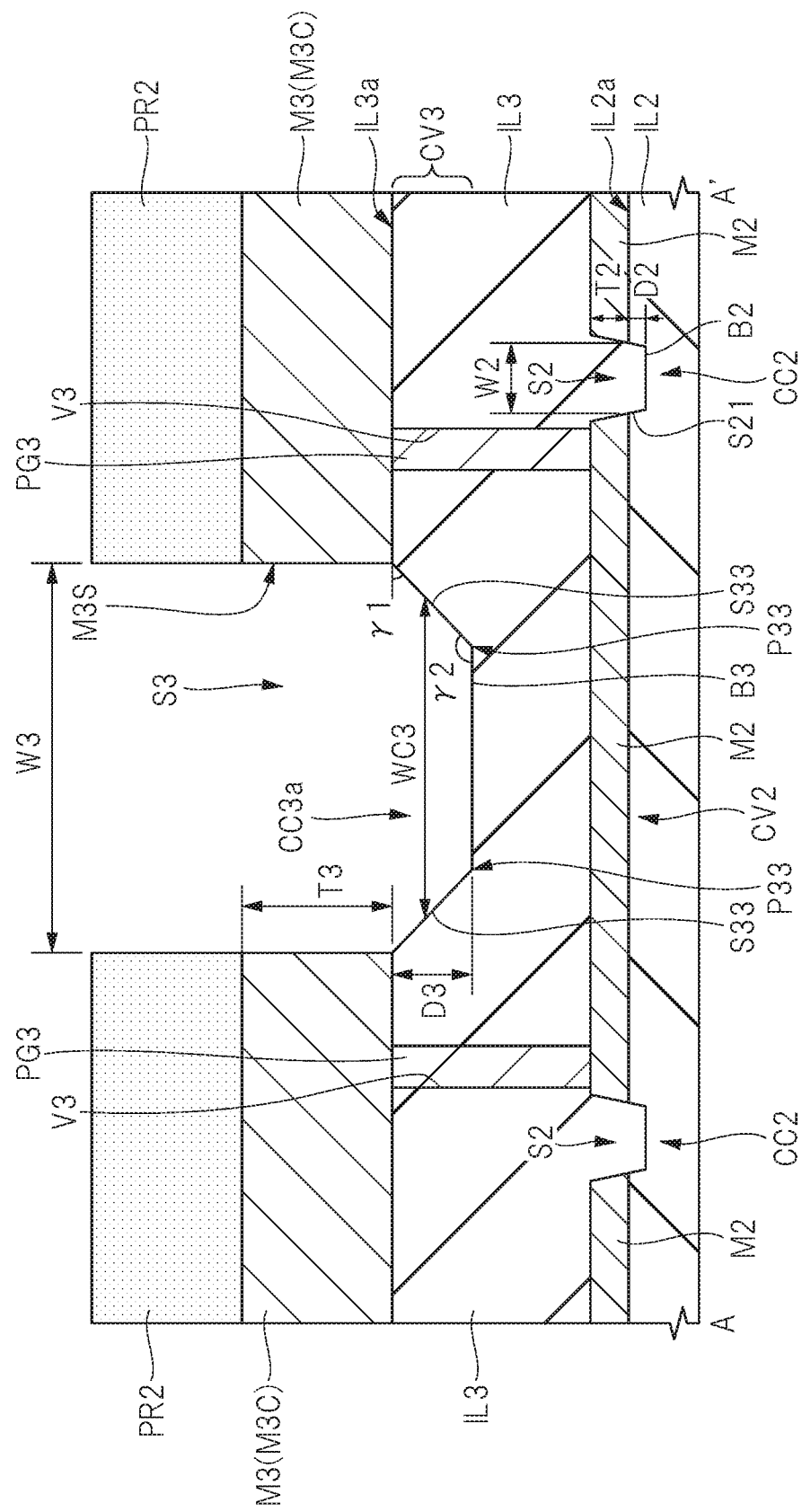
FIG. 15 is a cross-sectional view showing a manufacturing process of the semiconductor device according to the first modification.
Figure 16:
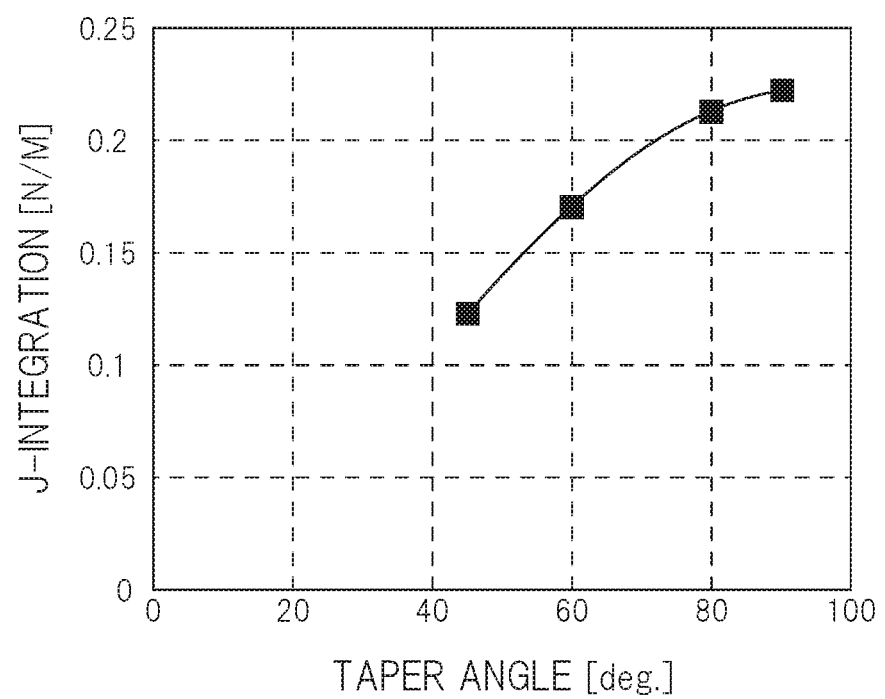
FIG. 16 is a graph showing the relationship between the taper angle of the side surface defining the recess and the J-integration.

Modification 1 is a modification to the first and second overetching steps included in the M 3 dry etching step of the above embodiment. The rest is the same as in the above embodiment. In the above embodiment, as shown in FIG. 4, the recess CC3 is defined by the side surfaces S 31 and S 32 having two different tilt angles, but in the first modification, the recess CC3a is defined by one straight side surface S33. FIG. 15 is a cross-sectional view showing a manufacturing process of the semiconductor device according to the first modification, and corresponds to FIGS. 12 and 13 of the above embodiment. FIG. 16 is a graph showing the relation between the taper angle and the J-integration of the side surface S33 defining the recess CC3a.

Similar to the above embodiment, the M 3 mask forming step shown in FIG. 5 is performed, and subsequently, the dry etching step of the conductor layer M 3 C corresponding to FIG. 11 is performed to form the wiring M 3. Here, an example in which the side surface M 3 S of the wire M 3 is processed perpendicularly to the upper surface IL3a of the interlayer insulating film IL3, that is, an example of β 2=90° in the above embodiment is shown. The dry etching process of the conductor layer M 3 C is performed under the same conditions as the dry etching process of M 3 C of the above embodiment, except that the high-frequency power is made higher in order to make the inclination of the side surface M 3 a 90°. After the dry etching process of the conductor layer M 3 C is completed, the overetching process of Modification 1 is performed. In the overetching step of the first modification, the recess CC3a is formed on the upper surface IL3a of the interlayer insulating film IL3 located between the adjoining wirings M 3. The recess CC3a is defined by the side surface S33 and the bottom surface B 3. The overetching process of Modification 1 is performed under the same conditions as the second overetching process of the above embodiment. As a result, the side S33 defining the recess CC3a forms an angle γ1 with respect to the extension line of the upper surface IL3a, and the angle γ1 is smaller than the angle β1 formed with respect to the extension line of the upper surface IL2a by the side S 21 of the recess CC2 formed on the upper surface IL2a of the interlayer insulating film IL2 (see FIG. 4b). That is, by making the slope of the side surface S33 gentle, the angle γ 2 of the side surface S33 and the bottom surface B 3 on the recess CC3a side can be made larger than 90° (γ 2>90°). Therefore, by the residual stress of the wiring M 3, the stress applied to the corner P 33 where the side surface S33 and the bottom surface B 3 intersect can be alleviated, and the occurrence of the crack CR can be prevented.

In the first modification, the recess CC3a is provided to prevent short-circuiting or leakage between the neighboring wirings M 3 and to prevent cracks CR from occurring. As described above, the recess CC2 is provided to prevent short-circuiting or leakage between the neighboring wirings M 2. Therefore, it is important to make the inclination (angle γ 1) of the side surface S33 more gradual than the inclination (angle β 1) of the side surface S21. In particular, even when the aspect ratio (T3/W3) of the space S3 sandwiched by the wirings M 3 on the recess CC3a and the aspect ratio (T2/W2) of the space S2 sandwiched by the wirings M 2 on the recess CC2 are substantially equal, the angle γ 1, which is the inclination angle of the side surface S33 of the recess CC3a, becomes smaller than the angle β 1, which is the inclination angle of the side surface S 21 of the recess CC2.

FIG. 16 shows the relationship between the angle γ 1, which is the inclination angle of the side surface S33 shown in FIG. 15, and the stress (J-integration) applied to the corner P 33. The smaller the angle γ 1, the more the stress is relaxed. The stress of γ 1=60° is reduced by about 25% with respect to the stress of γ 1=90°, and a sufficient stress relaxation effect can be obtained. Therefore, it is important to set the angle γ 1≤60°. From this graph, it can be said that it is important to set the angle β 3≤60° in the above embodiment.

Modification 2

Figure 17:
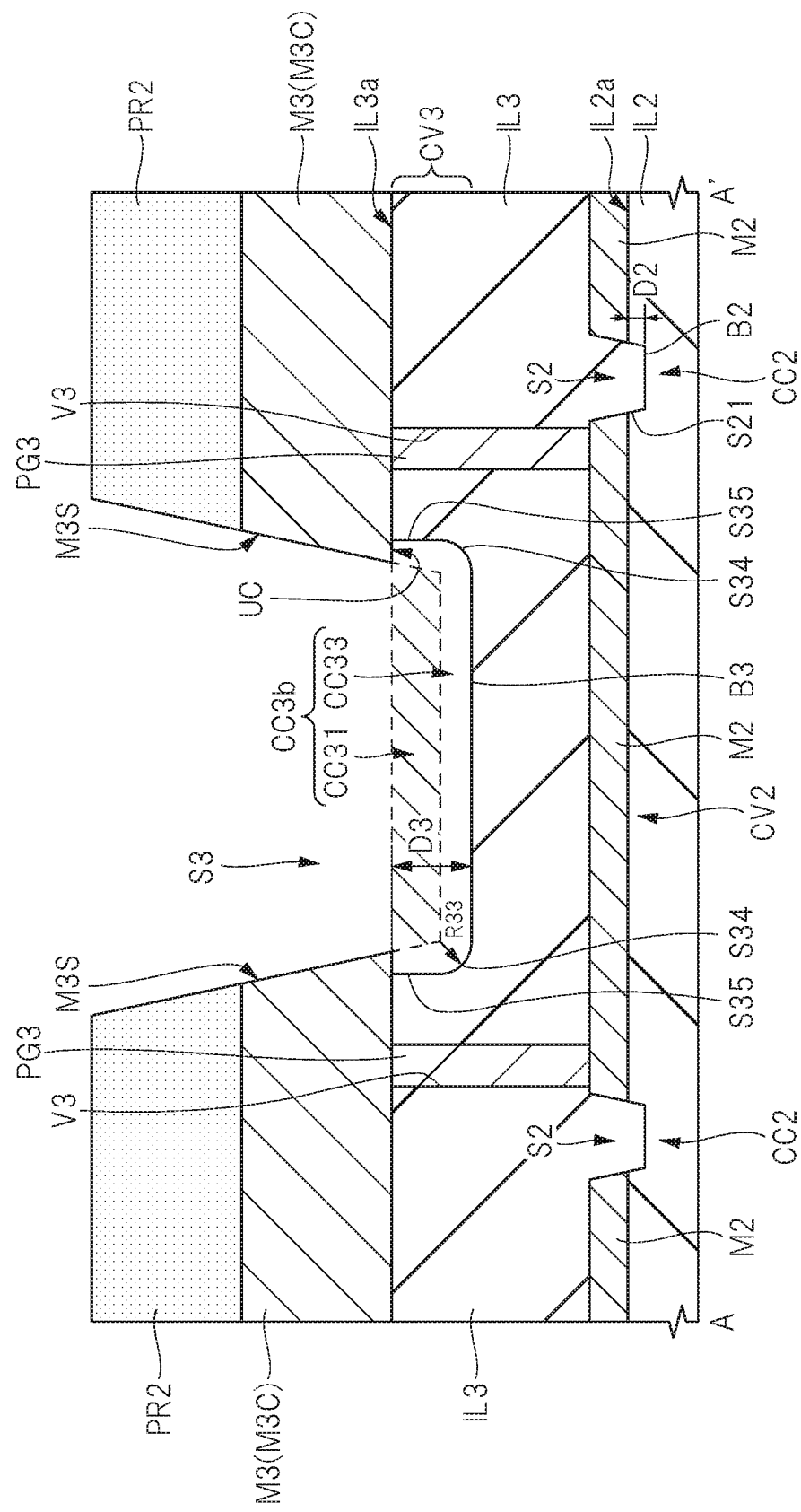
FIG. 17 is a cross-sectional view showing a manufacturing process of the semiconductor device according to the second modification.

Modification 2 is a modification to the second overetching step included in the M 3 dry etching step of the above embodiment. The rest is the same as in the above embodiment. FIG. 17 is a cross-sectional view showing a manufacturing process of the semiconductor device according to the second modification, and corresponds to FIG. 13 of the above embodiment.

Figure 18:
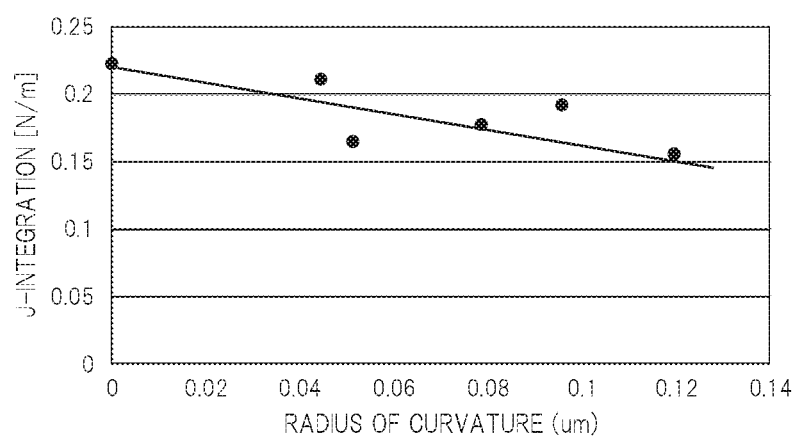
FIG. 18 is a graph showing the relationship between the radius of curvature and the J-integration of the side surface constituting the recess of FIG. 17.

In the above embodiment, dry etching with weakened anisotropy is performed in the second overetching step, but in the overetching step of Modification 2, isotropic etching is performed to form the recess CC33. FIG. 18 is a graph showing the relation between the radii of curvature of the side surfaces S 34 constituting the recess CC3b of FIG. 17 and J-integration.

As described in the above embodiment, after the dry etching process and the first overetching process of the interconnection layer M 3 C are performed, the overetching process of the second modification is performed to form the recess CC33. The recess CC3b of the second modification includes recesses CC31 and CC33, and is defined by a straight side surface S 35, a straight bottom surface B 3, and an arc-shaped side surface S 34 connecting the side surface S 35 and the bottom surface B 3. Since the recess CC33 is formed by isotropic etching, the undercut portion U C in which the interlayer insulating film IL3 does not exist is formed under the wiring M 3.

The recess CC3b is provided to prevent short-circuiting or leakage between the neighboring wirings M 3 and to prevent cracks CR from occurring. By providing the arc-shaped side surface S 34 between the side surface S 35 and the bottom surface B 3, the stress applied to the side surface S 34 can be alleviated by the residual stress of the wiring M 3, and the occurrence of the crack CR can be prevented.

As shown in FIG. 18, the stress when the radius of curvature R 33 of the side surface S 34 is 0.08 μm or more (R 33≥0.08 μm) is reduced by about 20% or more with respect to the stress when the radius of curvature R 33 is zero, and a sufficient stress relaxation effect can be obtained. Therefore, it is important to set the radius of curvature R 33≤0.08 μm. As described in the above embodiment, it is known that when the recess CC2 is anisotropically dry-etched on the interlayer insulating film IL2, the corner portion P 2, which is the intersection of the side surface S 21 and the bottom surface B 2, has an arc shape. However, since the recess CC2 is provided to prevent short-circuiting or leakage between the neighboring wirings M 2 and does not also serve as a stress-relieving function, the radius of curvature of the corner portion P 2 is 0.01 μm or less. That is, the radius of curvature of the arc-shaped side surface S 34 of the recess CC3b provided in the interlayer insulating film IL3 is larger than the radius of curvature of the corner portion P 2 of the recess CC2 provided in the interlayer insulating film IL2.

Modification 3

Figure 19:
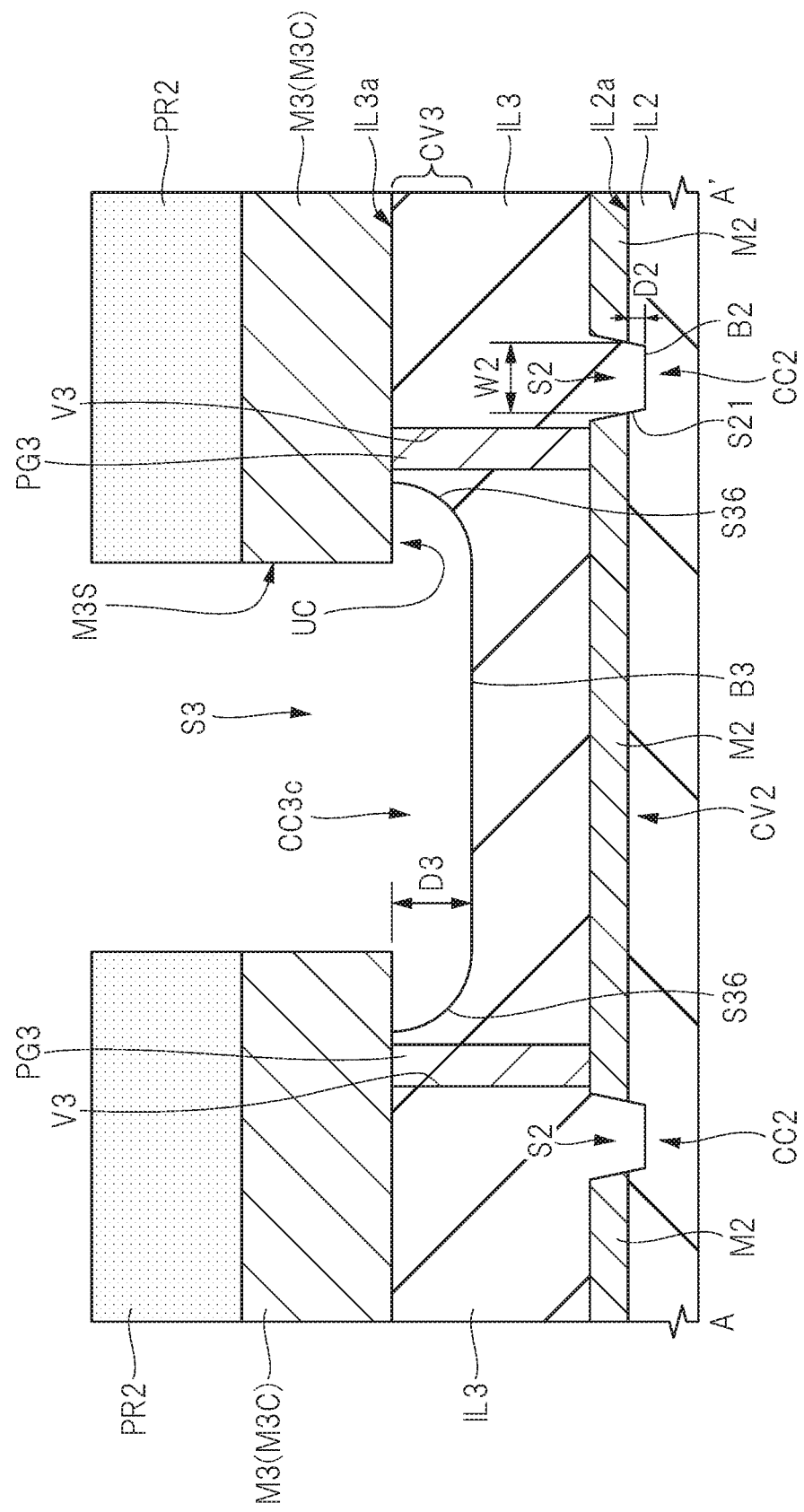
FIG. 19 is a cross-sectional view showing a manufacturing process of a semiconductor device according to Modification 3.
Figure 20:
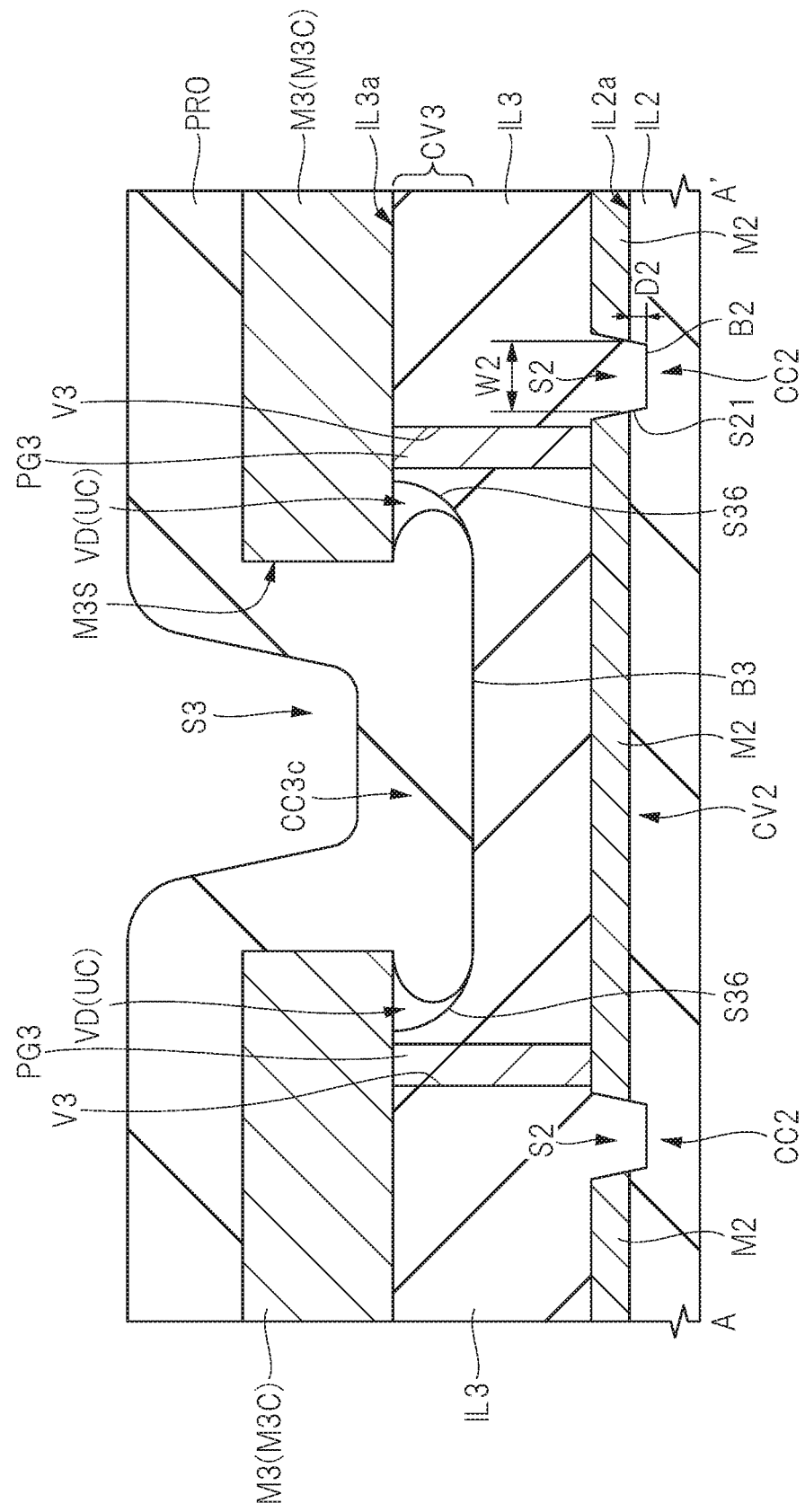
FIG. 20 is a cross-sectional view showing the manufacturing process of the semiconductor device continued from FIG. 19.

Modification 3 is a modification of the overetching process of Modification 1. FIGS. 19 and 20 are cross-sectional views showing a manufacturing process of a semiconductor device according to Modification 3, FIG. 19 corresponds to FIG. 15 of Modification 1 and FIGS. 12 and 13 of the embodiment, and FIG. 20 corresponds to FIG. 14 of the embodiment. The rest is the same as in Modification 1 or the above embodiment.

As shown in FIG. 19, a recess CC3c is formed on the upper surface IL3a of the interlayer insulating film IL3 located between the adjoining wirings M 3. The recess CC3c is defined by an arc-shaped side surface S 36 and a bottom surface B 3. In the third modification, after the dry etching process of the conductive layer M 3 C is completed, isotropic dry etching is performed on the interlayer insulating film IL3 to form the recess CC3c. Therefore, the radius of curvature of the arc-shaped side surface S 36 is substantially equal to the depth D 3 of the recess CC3c. As described above, since the arc-shaped side surfaces S 36 are provided at both ends of the recess CC3c, the stress applied to the side surfaces S 36 can be alleviated by the residual stress of the wire M 3, and the generation of the above-described crack CR can be prevented. As described with reference to FIG. 18, it is important that the radius of curvature of the side surface S 36 is 0.08 μm or more.

As a characteristic of the third modification, an undercut UC is formed at the lower portion of the wiring M 3 approximately equal to the depth D3. As shown in FIG. 20, even after the protective film PRO is formed on the interconnection M 3, a gap VD remains between the protective film PRO and the interlayer insulating film IL3 in the undercut portion UC.

Modification 4

Modification 4 is a modification to Modification 3, and provides a structure in which the undercut portion UC of FIG. 19 does not exist. FIGS. 21 to 24 are cross-sectional views showing a manufacturing process of a semiconductor device according to Modification 4. FIGS. 21 to 24 correspond to the M 3 dry etching process of the above embodiment. The rest is the same as in the above embodiment.

Figure 21:
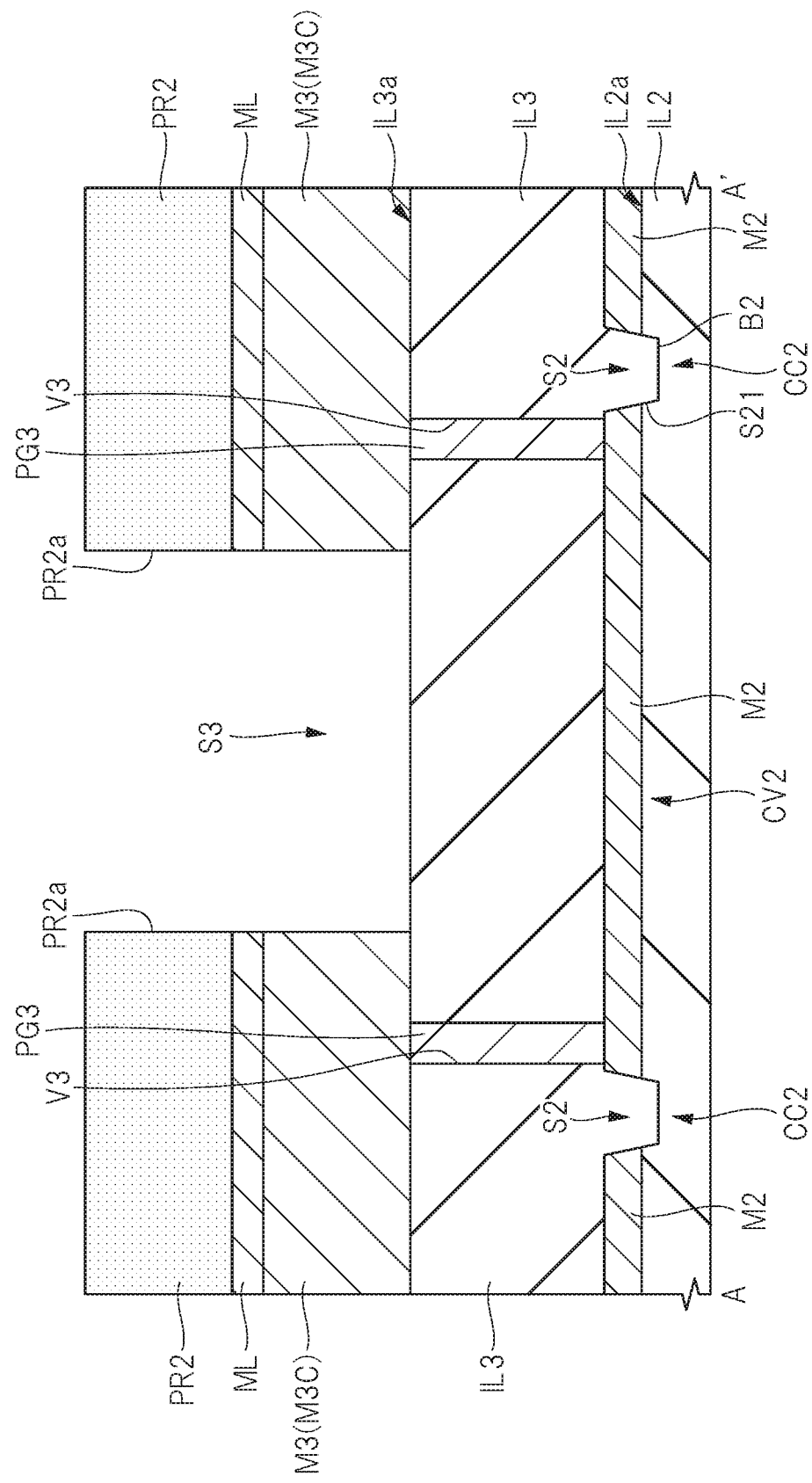
FIG. 21 is a cross-sectional view showing a manufacturing process of a semiconductor device according to Modification 4.

FIG. 21 shows a stage in which the dry etching process of the conductor layer M 3 C is completed. In the fourth modification, a metal film ML made of, for example, titanium nitride TiN is provided on the wiring M 3. In the dry etching process of the conductive layer M 3 C, the interconnection M 3 is formed without etching the interlayer insulating film IL3. That is, no recess is formed on the upper surface IL3a of the interlayer insulating film IL3 between the neighboring wirings M 3. In order to prevent the interlayer insulating film IL3 from being etched, the conductive film M 3 C may be left thinly on the upper surface IL3a of the interlayer insulating film IL3 in the spaces S3 between the neighboring wirings M 3.

Figure 22:
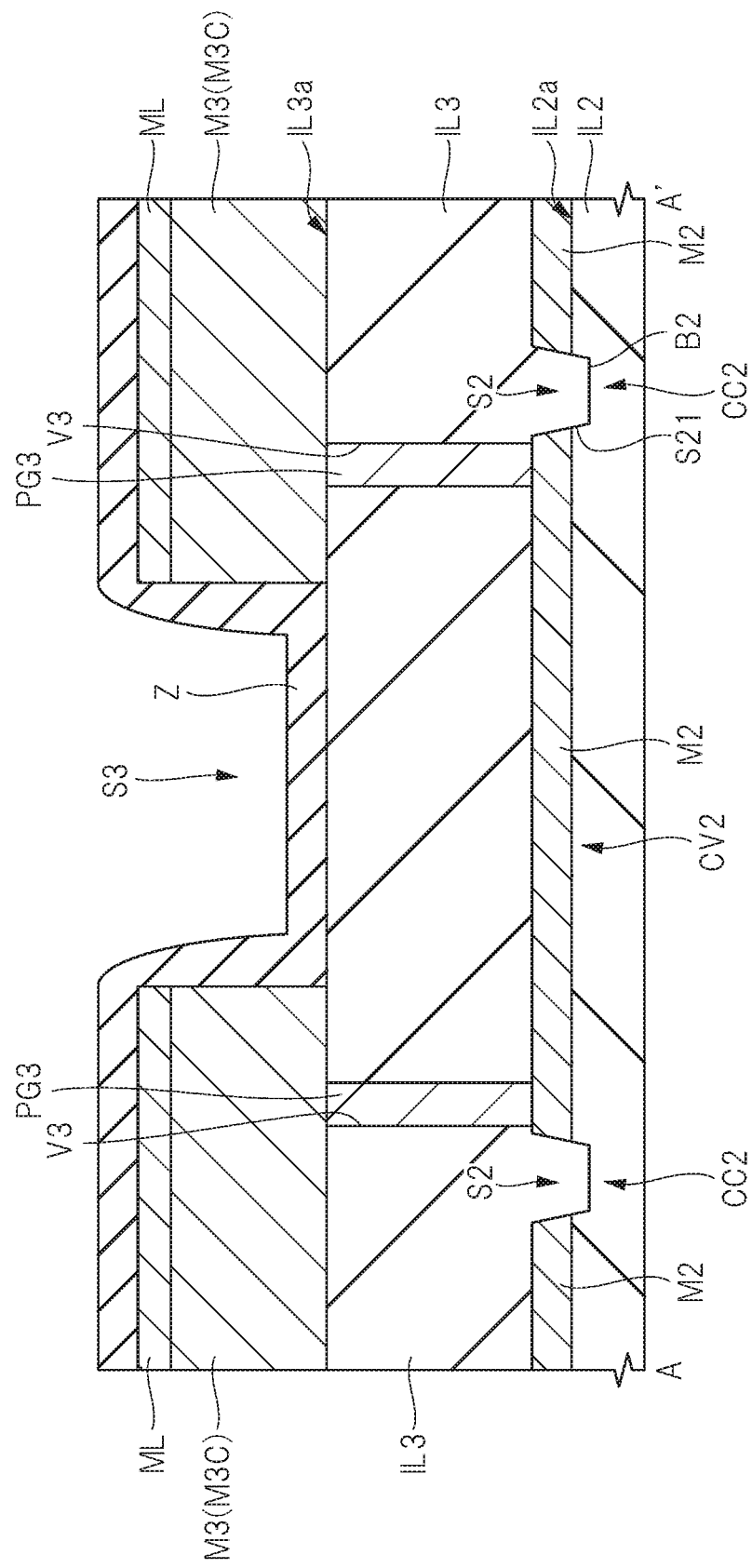
FIG. 22 is a cross-sectional view showing the manufacturing process of the semiconductor device continued from FIG. 21.
Figure 23:
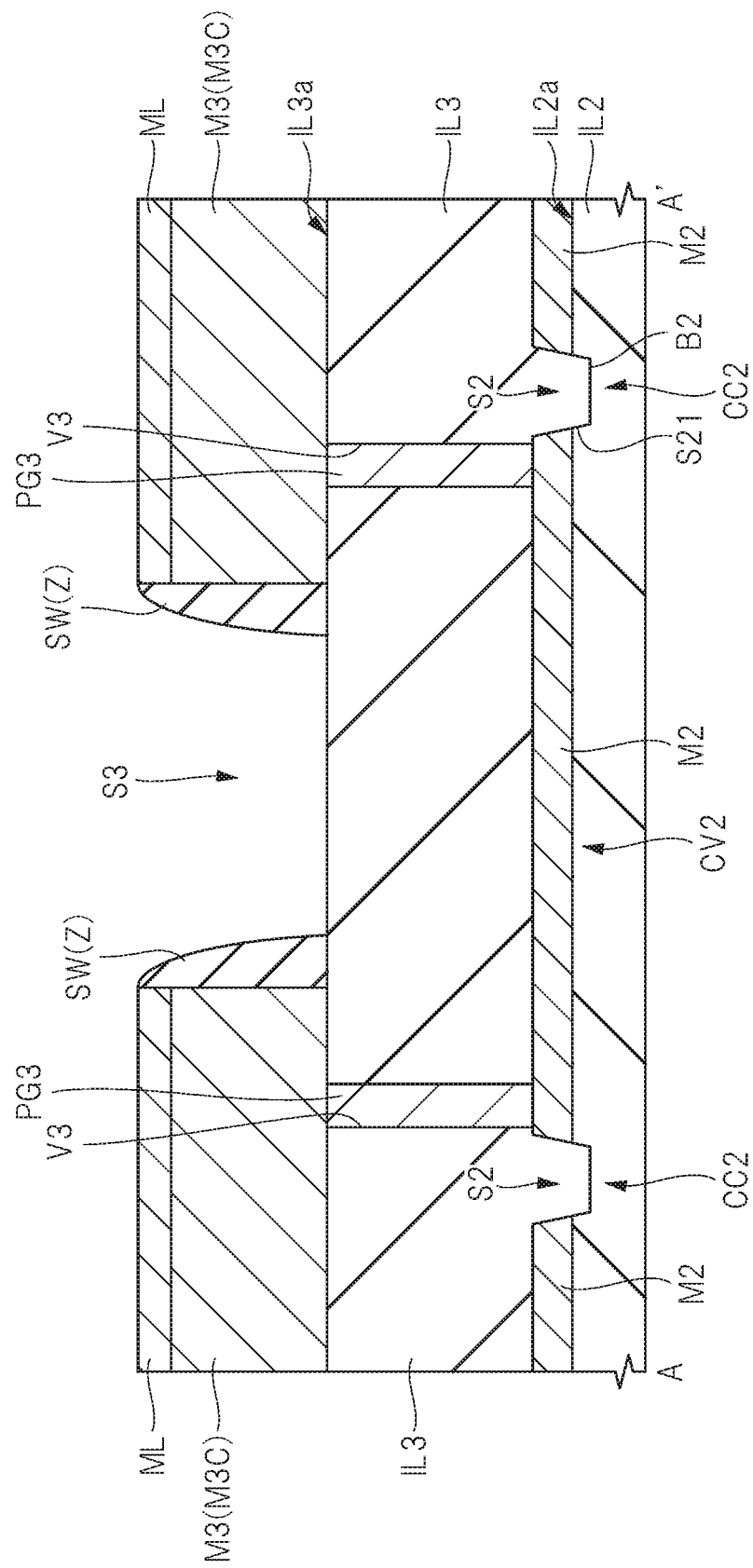
FIG. 23 is a cross-sectional view showing the manufacturing process of the semiconductor device continued from FIG. 22.
Figure 24:
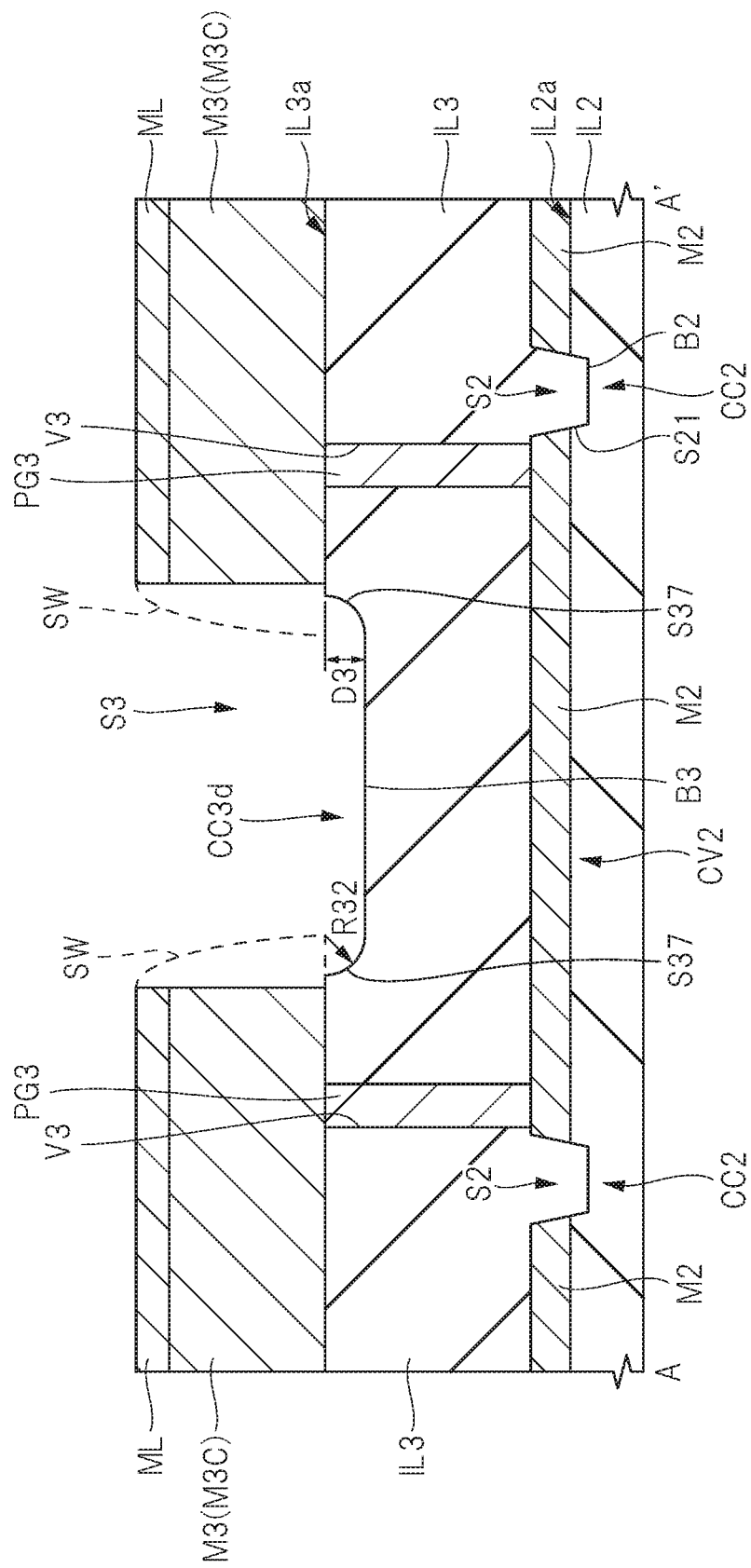
FIG. 24 is a cross-sectional view showing the manufacturing process of the semiconductor device continued from FIG. 23.

Next, after removing the photo resist layer PR2, as shown in FIG. 22, an insulating film Z made of, for example, a silicon oxide film is deposited so as to cover the interlayer insulating film IL3, the metallic film ML, and the interconnection M 3. Next, as shown in FIG. 23, anisotropic dry etching, for example, is performed on the insulating film Z to form a sidewall insulating film SW on the side walls of the wiring M 3 and the metal film ML. Next, as shown in FIG. 24, the interlayer insulating film IL3 and the sidewall insulating film SW are subjected to isotropic dry etching to form a recess CC3d in the interlayer insulating film IL3. The recess CC3d is defined by an arc-shaped side surface S37 formed on the interlayer insulating film IL3 and a bottom surface B 3, and the radius of curvature of the side surface S37 is substantially equal to the depth D 3 of the recess CC3d. As described above, by forming the recess CC3d in the interlayer insulating film IL3 with the sidewall insulating film SW provided, undercutting of the lower portion of the interconnection M 3 can be prevented or reduced. When the undercut is zero, the end portion of the recess CC3d is not overlapped with the wiring M 3 and terminates in the area between the neighboring wirings M 3.

As described above, by providing the arc-shaped side surface S37 on the recess CC3d, the stress applied to the side surface S37 can be alleviated by the residual stress of the wire M 3, and the generation of the above-described crack CR can be prevented.

In addition, as shown in FIG. 21, when the interconnection layer M3C is processed, a recess is not formed on the upper surface IL3a of the interlayer insulating film IL3, so that it is possible to prevent the crack CR from being generated at this stage.

When the conductor film M 3 C is left thin on the upper surface IL3a of the interlayer insulating film IL3, the sidewall insulating film SW is formed, and then the thin conductor film M 3 C is removed, and thereafter, the recess CC3d is formed in the interlayer insulating film IL3. When the thin conductor film M 3 C is removed, since the wiring M 3 is covered with the metal film ML, the wiring M 3 is not etched.

The invention made by the present inventor has been described above in detail based on the embodiment, but the present invention is not limited to the embodiment described above, and it is needless to say that various modifications can be made without departing from the gist thereof. Part of the contents described in the above embodiments will be described below.

APPENDIX 1

A method of manufacturing a semiconductor device comprising the steps of:

(a) forming a first interlayer insulating film including a first upper surface on a main surface of a semiconductor substrate;

(b) depositing a first aluminum layer having a first thickness on the first upper surface;

(c) performing dry etching treatment to the first aluminum layer to form a first wiring and a second wiring;

(d) following the step (c), forming a first recess extending from the first upper surface to the main surface in a region between the first wiring and the second wiring;

(e) forming a second interlayer insulating film including a second upper surface on the first upper surface so as to cover the first wiring and the second wiring;

(f) performing chemical mechanical polishing treatment to the second interlayer insulating film to planarize the second upper surface;

(g) following the step (f), forming an opening in the second interlayer insulating film to expose a portion of the first wiring, and then forming a conductor layer in the opening so as to bury the opening;

(h) following the step (g), depositing a second aluminum layer having a second thickness thicker than the first thickness on the second upper surface;

(i) performing dry etching treatment to the second aluminum layer to form a third wiring and a fourth wiring, and (j) following the step (i), in a region between the third wiring and the fourth wiring, forming a second recess extending from the second upper surface toward the first upper surface in the second interlayer insulating film, wherein the second recess is defined by a first straight side connected to the second upper surface and a second straight side connected to the first side surface in cross-sectional view, and wherein the second side surface is inclined so that the width of the second recess decreases in a direction from the second upper surface to the first upper surface.

APPENDIX 2

The method for manufacturing a semiconductor device according to Appendix 1, wherein the dry etching process is performed by placing the semiconductor substrate on a lower electrode in a dry etching apparatus and applying high-frequency power to the lower electrode, and wherein a first power of the high-frequency power when forming a second side surface of the second recess is lower than a second power of the high-frequency power when forming the first side surface of the second recess.

APPENDIX 3

A method of manufacturing a semiconductor device comprising the steps of:

(a) forming a first interlayer insulating film including a first upper surface on the main surface of the semiconductor substrate;

(b) depositing a first aluminum layer having a first thickness on the first upper surface;

(c) performing dry etching treatment to the first aluminum layer to form a first wiring and a second wiring;

(d) following the step (c), in a region between the first wiring and the second wiring, forming a first recess extending from the first upper surface toward the main surface in the first interlayer insulating film;

(e) forming a second interlayer insulating film including a second upper surface on the first upper surface to cover the first wiring and the second wiring;

(f) performing chemical mechanical polishing treatment to the second interlayer insulating film to planarize the second upper surface;

(g) following the step (f), forming an opening in the second interlayer insulating film to expose a portion of the first wiring; and then forming a conductor layer in the opening so as to bury the opening;

(h) following the step (g), depositing a second aluminum layer having a second thickness thicker than the first thickness on the second upper surface;

(i) performing dry etching treatment to the second aluminum layer to form a third wiring and a fourth wiring, and (j) following the step (i), in a region between the third wiring and the fourth wiring, forming a second recess extending from the second upper surface to the first upper surface in the second interlayer insulating film, and wherein the first recess is defined by a first straight side surface connected to the first upper surface in cross-sectional view, wherein the second recess is defined by a second straight side surface connected to the second upper surface in cross-sectional view, wherein the second side surface is inclined in a direction from the second upper surface to the first upper surface to decrease the width of the second recess, and wherein a first angle formed by the first side surface with respect to the first upper surface is larger than a second angle formed by the second side surface with respect to the second upper surface.

APPENDIX 4

A method of manufacturing a semiconductor device comprising the steps of:

(a) forming a first interlayer insulating film including a first upper surface on a main surface of a semiconductor substrate;

(b) depositing a first aluminum layer having a first thickness on the first upper surface;

(c) performing dry etching treatment to the first aluminum layer to form a first wiring and a second wiring;

(d) following the step (c), in a region between the first wiring and the second wiring, forming a first recess extending from the first upper surface to the second wiring in a region between the first wiring and the second wiring in the first interlayer insulating film;

(e) forming a second interlayer insulating film including a second upper surface on the first upper surface to cover the first wiring and the second wiring;

(f) performing chemical mechanical polishing treatment to the second interlayer insulating film to planarize the second upper surface;

(g) following the step (f), forming an opening in the second interlayer insulating film to expose a portion of the first wiring, and then forming a conductor layer in the opening so as to bury the opening;

(h) following the step (g), depositing a second aluminum layer having a second thickness thicker than the first thickness on the second upper surface;

(i) performing dry etching treatment to the second aluminum layer to form a third wiring and a fourth wiring; and (j) following the step (i), in a region between the third wiring and the fourth wiring, forming a second recess extending from the second upper surface toward the first top surface in the second interlayer insulating film, and wherein the first recess is defined by a first straight side surface connected to the first upper surface and a second arc-shaped side surface connected to the first side surface in cross-sectional view, wherein the second recess is defined by a third straight side surface connected to the second upper surface and a fourth arc-shaped side surface connected to the third side surface in cross-sectional view, wherein the first radius of curvature of the second side surface is smaller than the second radius of curvature of the fourth side surface.

APPENDIX 5

A method of manufacturing a semiconductor device comprising the steps of:

(a) forming a first interlayer insulating film including a first upper surface on a main surface of a semiconductor substrate;

(b) depositing a first aluminum layer having a first thickness on the first upper surface;

(c) performing dry etching treatment to the first aluminum layer to form a first wiring and a second wiring;

(d) following the step (c), forming a first recess extending from the first upper surface to the main surface in a region between the first wiring and the second wiring;

(e) forming a second interlayer insulating film including a second upper surface on the first upper surface to cover the first wiring and the second wiring;

(f) performing chemical mechanical polishing treatment to the second interlayer insulating film to planarize the second upper surface;

(g) following the step (f), forming an opening in the second interlayer insulating film to expose a portion of the first wiring, and then forming a conductor layer in the opening so as to bury the opening;

(h) following the step (g), depositing a second aluminum layer having a second thickness thicker than the first thickness on the second upper surface;

(i) performing dry etching treatment to the second aluminum layer to form a third wiring and a fourth wiring, and (j) following the step (i), in a region between the third wiring and the fourth wiring, forming a second recess extending from the second upper surface to the first upper surface in the second interlayer insulating film, wherein the second recess is defined by an arc-shaped first side surface in a cross-sectional view, wherein the second recess extends to a lower portion of the third wiring, and the first recess does not extend to a lower portion of the first wiring.

APPENDIX 6

A method of manufacturing a semiconductor device comprising the steps of:

(a) forming a first interlayer insulating film including a first upper surface on the main surface of the semiconductor substrate;

(b) depositing a first aluminum layer having a first thickness on the first upper surface;

(c) performing dry etching treatment to the first aluminum layer to form a first wiring and a second wiring;

(d) following the step (c), forming a first recess extending from the first upper surface to the main surface in a region between the first wiring and the second wiring;

(e) forming a second interlayer insulating film including a second upper surface on the first upper surface so as to cover the first wiring and the second wiring;

(f) performing chemical mechanical polishing treatment to the second interlayer insulating film to planarize the second upper surface;

(g) following the step (f), forming an opening in the second interlayer insulating film to expose a portion of the first wiring, and then selectively forming a conductive layer in the opening so as to bury the opening;

(h) following the step (g), depositing a second aluminum layer having a second thickness thicker than the first thickness on the second upper surface;

(i) performing dry etching treatment to the second layer to form a third wiring and a fourth wiring, (j) forming a sidewall insulating film on the sidewall of the third wiring and the fourth wiring, and (k) following the step (j), forming a second recess extending from the second upper surface to the first upper surface in the second interlayer insulating film in a region between the third wiring and the fourth wiring, wherein the second recess is defined by an arc-shaped first side surface, and wherein the end of the second recess is terminated in a region between the third wiring and the fourth wiring without overlapping the third wiring and the fourth wiring.

APPENDIX 7

A semiconductor device comprising:
a semiconductor substrate including a main surface,
a first interlayer insulating film including a first upper surface that is formed on the main surface of the semiconductor substrate;
a first wiring formed on the first upper surface;
a second interlayer insulating film including a second upper surface that is formed on the first upper surface so as to cover the first wiring; and
a second wiring formed on the second upper surface,
wherein the first wiring has a first film thickness,
wherein the second wiring has a second film thickness greater than the first film thickness,
the first interlayer insulating film has a first recess extending from the first upper surface toward the main surface in a region in contact with the first wiring;
the second interlayer insulating film has a second recess extending from the second upper surface toward the first surface;
the second interlayer insulating film has a second recess extending from the second upper surface toward the first upper surface in a region in contact with the second wiring, and
wherein the first recess is defined by a first straight side surface connected to first upper surface and an arc-shaped second side surface connected to the first side surface in cross-sectional view, wherein the second recess defined by a third straight side surface connected to second upper surface and an arc-shaped fourth side surface connected to the third side surface,
wherein a first radius of curvature of the second side surface is smaller than a second radius of curvature of the fourth side surface.

APPENDIX 8

The semiconductor device according to Appendix 7, further comprising:
a third wiring formed on the first upper surface; and
a fourth wiring formed on the second upper surface,
wherein the first recess is formed in a region between the first wiring and the third wiring,
wherein the second recess is formed in a region between the second wiring and the fourth wiring,
wherein the first wiring and the third wiring are formed of a first aluminum layer having the first thickness, and
the second wiring and the fourth wiring are formed of a second aluminum layer having the second thickness.

APPENDIX 9

The semiconductor device according to Appendix 7, the second radius of curvature is 0.08 μm or more.

What is claimed is:
1. A semiconductor device, comprising:
a semiconductor substrate including a main surface;
a first interlayer insulating film formed on the main surface of the semiconductor substrate and including a first upper surface;
a first wiring formed on the first upper surface of the first interlayer insulating;
a second interlayer insulating film formed on the first upper surface of the first interlayer insulating film and including a second upper surface so that the second interlayer insulating film covers the first wiring; and
a second wiring formed on the second upper surface of the second interlayer insulating film,
wherein the first wiring has a first film thickness,
wherein the second wiring has a second film thickness greater than the first film thickness,
wherein the second interlayer insulating film has a first recess extending from the second upper surface toward the first upper surface in a region in contact with the second wiring,
wherein the first recess is defined by a first side surface connected to the second upper surface and a second side surface connected to the first side surface in cross-sectional view, and
wherein the second side surface is inclined so that a width of the first recess decreases in a direction from the second upper surface toward the first upper surface.

2. The semiconductor device according to claim 1, further comprising:
a third wiring formed on the second upper surface,
wherein the first recess is formed in a region between the second wiring and the third wiring,
wherein the first wiring is formed of a first aluminum layer having the first film thickness, and
wherein the second wiring and the third wiring are formed of a second aluminum layer having the second film thickness.

3. The semiconductor device according to claim 2,
wherein the first side surface forms a first angle with respect to the second upper surface, wherein the second side surface forms a second angle with respect to the second upper surface, and wherein the second angle is less than the first angle.

4. The semiconductor device according to claim 3, wherein the first angle includes 90°.

5. The semiconductor device according to claim 3, wherein the second angle is 60 degrees or less.

6. The semiconductor device according to claim 3, further comprising:

a fourth wiring formed on the first upper surface, wherein the first interlayer insulating film has a second recess that is extended from the first upper surface toward the main surface in a region between the first wiring and the fourth wiring, wherein the second recess is defined by a third side surface in cross-sectional view, and wherein the third angle formed by the third side surface with respect to the first upper surface is larger than the second angle.

7. A semiconductor device comprising:

a semiconductor substrate including a main surface;

a first interlayer insulating film formed on the main surface of the semiconductor substrate and including a first upper surface;

a first wiring formed on the first upper surface of the first interlayer insulating film;

a second interlayer insulating film formed on the first upper surface of the first interlayer insulating film and including a second upper surface so that the second interlayer insulating film covers the first wiring; and a second wiring formed on the second upper surface of the second interlayer insulating film, wherein the first wiring has a first film thickness, wherein the second wiring has a second film thickness greater than the first film thickness, wherein the first interlayer insulating film has a first recess that is extended from the first upper surface toward the main surface in a region in contact with the first wiring, wherein the second interlayer insulating film has a second recess that is extended from the second upper surface toward the first upper surface in a region in contact with the second wiring, wherein the first recess is defined by a first straight side surface in cross-sectional view, wherein the second recess is defined by a second straight side surface in cross-sectional view, wherein the second side surface is inclined so that a width of the second recess decreases in a direction from the second upper surface toward the first upper surface, and wherein a first angle that is formed by the first side surface with respect to the first upper surface is larger than a second angle that is formed by the second side surface with respect to the second upper surface.

8. The semiconductor device according to claim 7, further comprising:

a third wiring formed on the first upper surface; and a fourth wiring formed on the second upper surface, wherein the first recess is formed in a region between the first wiring and the third wiring, wherein the second recess is formed in a region between the second wiring and the fourth wiring, wherein the first wiring and the third wiring are formed of a first aluminum layer having the first thickness, and wherein the second wiring and the fourth wiring are formed of a second aluminum layer having the second thickness.

9. The semiconductor device according to claim 7, wherein the second angle is 60 degrees or less.

10. A semiconductor device, comprising:

a semiconductor substrate including a main surface;

a first interlayer insulating film formed on the main surface of the semiconductor substrate and including a first upper surface;

a first wiring formed on the first upper surface of the first interlayer insulating film;

a second interlayer insulating film formed on the first upper surface and including a second upper surface so that the second interlayer insulating film covers the first wiring; and a second wiring formed on the second upper surface of the second interlayer insulating film, wherein the first wiring has a first film thickness, the second wiring has a second film thickness greater than the first film thickness, wherein the first interlayer insulating film has a first recess extending from the first upper surface toward the main surface in a region in contact with the first wiring, the second interlayer insulating film has a second recess extending from the second upper surface toward the first upper surface in a region in contact with the second wiring;

wherein the second interlayer insulating film has a second recess extending from the second upper surface toward the first upper surface in a region in contact with the second wiring, and wherein the second recess extends to a lower portion of the second wiring in cross-sectional view.

11. The semiconductor device according to claim 10, further comprising:

a third wiring formed on the first upper surface; and a fourth wiring formed on the second upper surface, wherein the first recess is formed in a region between the first wiring and the third wiring, wherein the second recess is formed in a region between the second wiring and the fourth wiring, wherein the first wiring is formed of a first aluminum layer having the first film thickness, wherein the second wiring is formed of a second aluminum layer having the second film thickness, wherein the second recess is defined by an arc-shaped first side surface, and wherein the first recess does not extend below the first wiring.

12. The semiconductor device according to claim 11, wherein the radius of curvature of the first side surface is 0.08 μm or more.

13. The semiconductor device according to claim 10, further comprising:

a protective film formed on the second wiring so as to fill the second recess, wherein a void that is not filled with the protective film is present in a lower portion of the second wiring in the second recess.

* * * * *